(12) United States Patent
Do et al.

(10) Patent No.: US 9,105,620 B1
(45) Date of Patent: Aug. 11, 2015

(54) INTEGRATED CIRCUIT PACKAGING SYSTEM WITH ROUTABLE TRACES AND METHOD OF MANUFACTURE THEREOF

(71) Applicants: Byung Tai Do, Singapore (SG); Arnel Senosa Trasporto, Singapore (SG); Linda Pei Ee Chua, Singapore (SG); Asri Yusof, Singapore (SG)

(72) Inventors: Byung Tai Do, Singapore (SG); Arnel Senosa Trasporto, Singapore (SG); Linda Pei Ee Chua, Singapore (SG); Asri Yusof, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 141 days.

(21) Appl. No.: 14/038,577

(22) Filed: Sep. 26, 2013

Related U.S. Application Data

(60) Provisional application No. 61/746,264, filed on Dec. 27, 2012.

(51) Int. Cl.
*H01L 23/495* (2006.01)
*H01L 23/00* (2006.01)

(52) U.S. Cl.
CPC .......... *H01L 23/49517* (2013.01); *H01L 24/89* (2013.01)

(58) Field of Classification Search
CPC ........... H01L 2224/48247; H01L 2224/32245; H01L 2924/014; H01L 23/49582; H01L 2224/0401; H01L 23/495; H01L 23/49541; H01L 23/49568; H01L 21/4828; H01L 23/3121

USPC .................................................... 257/666, 676
See application file for complete search history.

(56) References Cited

U.S. PATENT DOCUMENTS

| | | | |
|---|---|---|---|
| 5,683,943 A * | 11/1997 | Yamada | 216/14 |
| 6,238,845 B1 * | 5/2001 | Moehle et al. | 430/314 |
| 7,741,149 B2 | 6/2010 | Qiao et al. | |
| 8,084,299 B2 * | 12/2011 | Tan et al. | 438/111 |
| 8,455,304 B2 | 6/2013 | Lam | |
| 8,513,786 B2 | 8/2013 | McMillan et al. | |
| 8,519,518 B2 * | 8/2013 | Do et al. | 257/676 |
| 8,659,131 B2 * | 2/2014 | Kim et al. | 257/676 |
| 2012/0007234 A1 | 1/2012 | Tsai et al. | |
| 2012/0139104 A1 | 6/2012 | Camacho et al. | |
| 2012/0181680 A1 | 7/2012 | Li | |
| 2012/0280376 A1 | 11/2012 | Do et al. | |
| 2012/0280377 A1 | 11/2012 | Do et al. | |

* cited by examiner

*Primary Examiner* — Roy Potter
(74) *Attorney, Agent, or Firm* — Ishimaru & Associates LLP

(57) ABSTRACT

A system and method of manufacture of an integrated circuit packaging system includes: a leadframe with a conductive layer on a leadframe active side for protecting a lead pad and a routable trace, the leadframe having an overmold recess at a leadframe inactive side; an overmold layer in the overmold recess, the overmold layer exposed between the lead pad and the routable trace for forming the lead pad and routable trace; an encapsulation directly on the conductive layer, the lead pad, the routable trace, and the overmold layer; and an external interconnect at the leadframe inactive side.

20 Claims, 13 Drawing Sheets

INTEGRATED CIRCUIT PACKAGING SYSTEM WITH ROUTABLE TRACES AND METHOD OF MANUFACTURE THEREOF

CROSS-REFERENCE TO RELATED APPLICATION

This application claims the benefit of U.S. Provisional Patent Application Ser. No. 61/746,264 filed Dec. 27, 2012, and the subject matter thereof is incorporated herein by reference thereto.

TECHNICAL FIELD

The present invention relates generally to an integrated circuit packaging system, and more particularly to a system with routable traces.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Research and development strategies focus on new technologies as well as on improving the existing and mature technologies. Research and development in the existing technologies can take a myriad of different directions.

Modern electronics requirements demand increased functionality in an integrated circuit package while providing less physical space in the system. While these approaches provide more functions within an integrated circuit, they do not fully address the requirements for lower height, smaller space, and cost reduction.

One way to reduce cost is to use mature package technologies with existing manufacturing methods and equipment. The reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. Ever-increasing commercial competitive pressures, along with growing consumer expectations, make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe with a conductive layer at a leadframe active side for protecting a lead pad and a routable trace, the leadframe having an overmold recess at a leadframe inactive side; forming an overmold layer in the overmold recess; etching a portion of the leadframe between the lead pad and the routable trace to expose the overmold layer for forming the lead pad and routable trace; mounting a die over the leadframe; forming an encapsulation directly on the conductive layer, the lead pad, the routable trace, the die, and the overmold layer; and forming an external interconnect at the leadframe inactive side.

The present invention provides an integrated circuit packaging system including: a leadframe with a conductive layer on a leadframe active side for protecting a lead pad and a routable trace, the leadframe having an overmold recess at a leadframe inactive side; an overmold layer in the overmold recess, the overmold layer exposed between the lead pad and the routable trace for forming the lead pad and routable trace; an encapsulation directly on the conductive layer, the lead pad, the routable trace, and the overmold layer; and an external interconnect at the leadframe inactive side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
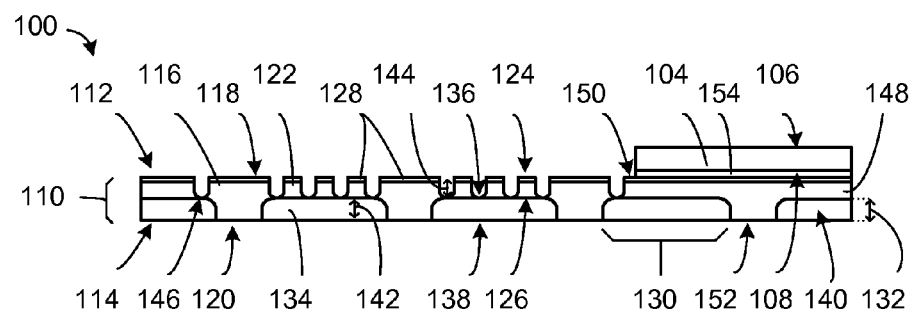
FIG. 1 is a cross-sectional view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "active side" refers to a side of a die, a module, a package, or an electronic structure having active circuitry fabricated thereon or having elements for connection to the active circuitry within the die, the module, the package, or the electronic structure. The term "inactive side" refers to the side opposite of the "active side".

The term "outer side" refers to the side of a die, a module, a package, or an electronic structure closest to the outside of a package or structure. The term "inner side" refers to the side opposite of the "outer side".

The term "processing" as used herein includes deposition of material or photoresist, patterning, exposure, development, etching, ablating, grinding, buffing, cleaning, and/or removal of the material or photoresist as required in forming a described structure.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

Referring now to FIG. 1, therein is shown a cross-sectional view of an integrated circuit packaging system 100 in a first embodiment of the present invention. The integrated circuit packaging system 100 can include a die 104 mounted over a leadframe 110.

The integrated circuit packaging system 100 can be formed by selectively etching portions of the leadframe 110. The leadframe 110 is a metal structure. The leadframe 110 can be used to form other conductive elements. The leadframe 110 can refer to the resulting conductive elements.

Etching is a process for removing material. Etching can include wet etching, dry etching, reactive ion etching, laser etching, laser ablation, mechanical etching, or a combination thereof.

The leadframe 110 can include a leadframe active side 112 and a leadframe inactive side 114. The leadframe active side 112 is the side having active circuitry fabricated thereon. The leadframe inactive side 114 is the side opposite from the leadframe active side 112.

The integrated circuit packaging system 100 can include lead pads 116. The lead pads 116 are conductive structures providing a conductive path from the leadframe active side 112 to a leadframe inactive side 114. The lead pads 116 can be formed by etching portions of the leadframe 110.

The lead pads 116 can include a lead pad active side 118 and a lead pad inactive side 120. The lead pad active side 118 is the side having active circuitry attached thereon. The lead pad inactive side 120 is the side opposite from the lead pad active side 118.

The integrated circuit packaging system 100 can include routable traces 122. The routable traces 122 are conductive structures for forming a conductive path. For example, the routable traces 122 can be used to form a conductive path from the die 104 to the lead pads 116. The routable traces 122 can be formed on the leadframe active side 112.

The routable traces 122 can include a trace top side 124 and a trace bottom side 126. The trace top side 124 is the side having active circuitry attached thereon. The trace bottom side 126 is the side opposite from the trace top side 124.

The routable traces 122 can include a conductive layer 128 on the leadframe active side 112. The conductive layer 128 is a thin layer of conductive material formed on the routable traces 122 to increase conductivity. For example, the conductive layer 128 can include a copper layer, a pre-plated leadframe layer, a metal layer, or a combination thereof The integrated circuit packaging system 100 can include the leadframe 110 having an overmold recess 130 formed on the leadframe inactive side 114. The overmold recess 130 can be formed by half-etching the leadframe 110. The recess can be formed directly below the routable traces 122 and between the lead pads 116. The overmold recess 130 has an overmold height 132. The overmold height 132 is the thickness of the overmold recess 130.

The overmold recess 130 can be etched to an overmold recess depth 142. For example, the overmold recess 130 can be formed by etching the leadframe 110 using a deep half etch process.

The integrated circuit packaging system 100 can include an overmold layer 134 formed within the overmold recess 130 in the leadframe 110. The overmold layer 134 is an electrically insulating structure.

The overmold layer 134 can include an overmold inner side 136 and an overmold outer side 138. The overmold outer side 138 is the side of the overmold layer 134 facing away from the leadframe 110. The overmold inner side 136 is the side of the overmold layer 134 facing toward the leadframe 110. The overmold outer side 138 can be coplanar with the lead pad inactive side 120.

The overmold layer 134 can act as an etch stop 146 when forming the lead pads 116 and the routable traces 122. The etch stop 146 is a structure for limiting further etching. The etch stop 146, such as the overmold layer 134, can provide precise control over the amount of etching performed.

The overmold layer 134 is formed with an overmold material 140, such as a resin, epoxy, polymer, or a combination thereof. The overmold material 140 is a substance that is electrically insulating and etch resistant.

For example, the overmold layer 134 can be formed directly on the trace bottom side 126. The routable traces 122 can be formed by etching portions of the leadframe 110 directly adjacent to the routable traces 122 down to the overmold inner side 136. Etching the leadframe 110 down to the overmold layer 134 allows a trace height 144 of the routable traces 122 to be precisely controlled.

The integrated circuit packaging system 100 can include a die paddle 148. The die paddle 148 is a structure for supporting an electrical component. The die paddle 148 can be formed by etching the leadframe 110. The conductive layer 128 is directly on and over the die paddle 148.

The die paddle 148 can include a die paddle top side 150 and a die paddle bottom side 152. The die paddle top side 150 is the side having active circuitry attached thereon. The die paddle bottom side 152 is the side opposite from the die paddle top side 150.

The integrated circuit packaging system 100 can include the die 104 mounted over the die paddle 148. The die 104 is an active microelectronic component. For example, the die 104 can be an integrated circuit, a processor, a microelectromechanical element, a flipchip, a leadless package, or a combination thereof.

The integrated circuit packaging system 100 can include a die top side 106 and a die bottom side 108. The die top side 106 is the side of the die 104 facing away from the leadframe 110. The die bottom side 108 is the side of the die 104 opposite of the die top side 106.

The die 104 can be mounted over the die paddle 148 with an adhesive layer 154. The adhesive layer 154 is a structure for attaching objects together. The adhesive layer 154 can be a polymer, epoxy, or combination thereof.

It has been discovered that forming the overmold layer 134 within the overmold recess 130 formed by half-etching the leadframe 110 increases manufacturing yield and reduces error rates. Forming the overmold recess 130 to a precise depth with the half-etch process allows the overmold layer 134 to act as the etch stop 146 to more accurately control the trace height 144 of the routable traces 122.

It has been discovered that forming the routable traces 122 over the overmold layer 134 increases quality and improves reliability. Forming the routable traces 122 by etching the leadframe 110 down to the overmold layer 134 provides precise control over the dimensions of the routable traces 122 and reduces the likelihood of incomplete etching causing short circuits.

Figure 2:
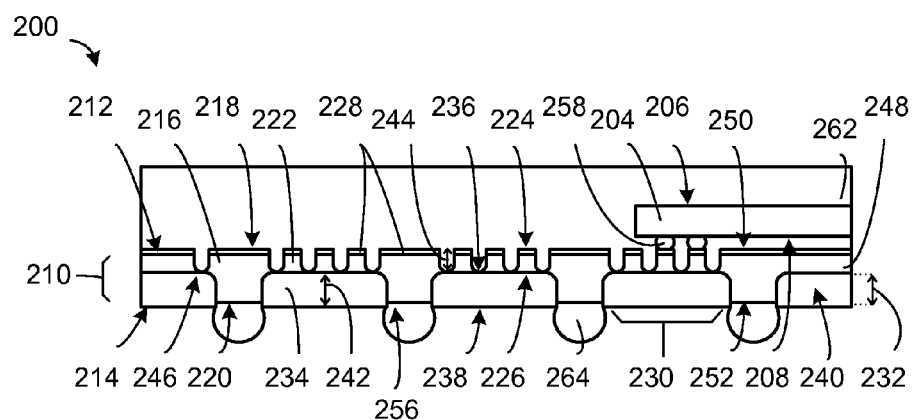
FIG. 2 is a cross-sectional view of an integrated circuit packaging system in a second embodiment of the present invention.

Referring now to FIG. 2, therein is shown a cross-sectional view of an integrated circuit packaging system 200 in a second embodiment of the present invention. The integrated circuit packaging system 200 can include a die 204 mounted over a leadframe 210. The die 204 can include a flipchip.

The integrated circuit packaging system 200 can be formed by selectively etching portions of the leadframe 210. The leadframe 210 is a metal structure. The leadframe 210 can be used to form other conductive elements. The leadframe 210 can refer to the resulting conductive elements.

Etching is a process for removing material. Etching can include wet etching, dry etching, reactive ion etching, laser etching, laser ablation, mechanical etching, or a combination thereof.

The leadframe 210 can include a leadframe active side 212 and a leadframe inactive side 214. The leadframe active side 212 is the side having active circuitry fabricated thereon. The leadframe inactive side 214 is the side opposite from the leadframe active side 212.

The integrated circuit packaging system 200 can include lead pads 216. The lead pads 216 are conductive structures providing a conductive path from the leadframe active side 212 to a leadframe inactive side 214. The lead pads 216 can be formed by etching portions of the leadframe 210.

The lead pads 216 can include a lead pad active side 218 and a lead pad inactive side 220. The lead pad active side 218 is the side having active circuitry attached thereon. The lead pad inactive side 220 is the side opposite from the lead pad active side 218.

The integrated circuit packaging system 200 can include routable traces 222. The routable traces 222 are conductive structures for forming a conductive path. For example, the routable traces 222 can be used to form a conductive path from the die 204 to the lead pads 216. The routable traces 222 can be formed on the leadframe active side 212.

The routable traces 222 can include a trace top side 224 and a trace bottom side 226. The trace top side 224 is the side having active circuitry attached thereon. The trace bottom side 226 is the side opposite from the trace top side 224.

The routable traces 222 can include a conductive layer 228 on the leadframe active side 212. The conductive layer 228 is a thin layer of conductive material formed on the routable traces 222 to increase conductivity. For example, the conductive layer 228 can include a copper layer, a pre-plated leadframe layer, a metal layer, or a combination thereof.

The routable traces 222 can be positioned directly below the die 204. The routable traces 222 can be electrically connected to the die 204 with internal interconnects 258. The internal interconnects 258 are an electrically conductive element. For example, the internal interconnects 258 can be a solder ball, solder bump, solder post, or a combination thereof. The internal interconnects 258 can be formed between the die 204 and routable traces 222.

The integrated circuit packaging system 200 can include the leadframe 210 having an overmold recess 230 formed on the leadframe inactive side 214. The overmold recess 230 can be formed by half-etching the leadframe 210. The recess can be formed directly below the routable traces 222 and between the lead pads 216. The overmold recess 230 has an overmold height 232. The overmold height 232 is the thickness of the overmold recess 230.

The overmold recess 230 can be etched to an overmold recess depth 242. For example, the overmold recess 230 can be formed by etching the leadframe 210 using a deep half etch process.

The integrated circuit packaging system 200 can include an overmold layer 234 formed within the overmold recess 230 in the leadframe 210. The overmold layer 234 is an electrically insulating structure.

The overmold layer 234 can include an overmold inner side 236 and an overmold outer side 238. The overmold outer side 238 is the side of the overmold layer 234 facing away from the leadframe 210. The overmold inner side 236 is the side of the overmold layer 234 facing toward the leadframe 210. The overmold outer side 238 can be coplanar with the lead pad inactive side 220.

The overmold layer 234 can act as an etch stop 246 when forming the lead pads 216 and the routable traces 222. The etch stop 246 is a structure for limiting further etching. The etch stop 246, such as the overmold layer 234, can provide precise control over the amount of etching performed.

The overmold layer 234 is formed with an overmold material 240, such as a resin, epoxy, polymer, or a combination thereof. The overmold material 240 is a substance that is electrically insulating and etch resistant.

For example, the overmold layer 234 can be formed directly on the trace bottom side 226. The routable traces 222 can be formed by etching portions of the leadframe 210 directly adjacent to the routable traces 222 down to the overmold inner side 236. Etching the leadframe 210 down to the overmold layer 234 allows a trace height 244 of the routable traces 222 to be precisely controlled.

The integrated circuit packaging system 200 can include a die paddle 248. The die paddle 248 is a structure for supporting an electrical component. The die paddle 248 can be formed by etching the leadframe 210. The conductive layer 228 is directly on and over the die paddle 248.

The die paddle 248 can include a die paddle top side 250 and a die paddle bottom side 252. The die paddle top side 250 is the side having active circuitry attached thereon. The die paddle bottom side 252 is the side opposite from the die paddle top side 250.

The integrated circuit packaging system 200 can include the die 204 mounted over the die paddle 248. The die 204 is an active microelectronic component. For example, the die 204 can be an integrated circuit, a processor, a microelectromechanical element, a flipchip, a leadless package, or a combination thereof.

The integrated circuit packaging system 200 can include a die top side 206 and a die bottom side 208. The die top side 206 is the side of the die 204 facing away from the leadframe 210. The die bottom side 208 is the side of the die 204 opposite of the die top side 206.

The integrated circuit packaging system 200 can include an encapsulation 262 formed directly on and over the lead pads 216, the routable traces 222, and the die 204. The encapsulation 262 can be directly on the conductive layer 228, the lead pads 216, the routable traces 222, the overmold layer 234, the die 204, the internal interconnects 258, and the die paddle 248. The encapsulation 262 can be between the die 204 and the die paddle 248. The encapsulation can be between one of the routable traces 222 and another one of the routable traces 222.

The integrated circuit packaging system 200 can include a lead recess 256 at the lead pad inactive side 220. The lead recess 256 is formed at the lead pad inactive side 220 and between adjacent ones of the overmold layer 234.

The integrated circuit packaging system 200 can include external interconnects 264 attached to the lead pads 216 on the lead pad inactive side 220. The external interconnects 264 are electrically conductive structures for forming connections to external systems (not shown). For example, the external interconnects 264 can be solder balls, solder bumps, solder posts, or a combination thereof. The external interconnects 264 can be formed in the lead recess 256.

It has been discovered that forming the routable traces 222 over the overmold layer 234 increases quality and improves reliability. Forming the routable traces 222 by etching the leadframe 210 down to the overmold layer 234 provides precise control over the dimensions of the routable traces 222 and reduce the likelihood of incomplete etching causing short circuits.

It has been discovered that forming the overmold layer 234 within the overmold recess 230 formed by half-etching the leadframe 210 increases manufacturing yield and reduces error rates. Forming the overmold recess 230 to a precise depth with the half-etch process allows the overmold layer 234 to act as the etch stop 246 to more accurately control the trace height 244 of the routable traces 222.

Figure 3:
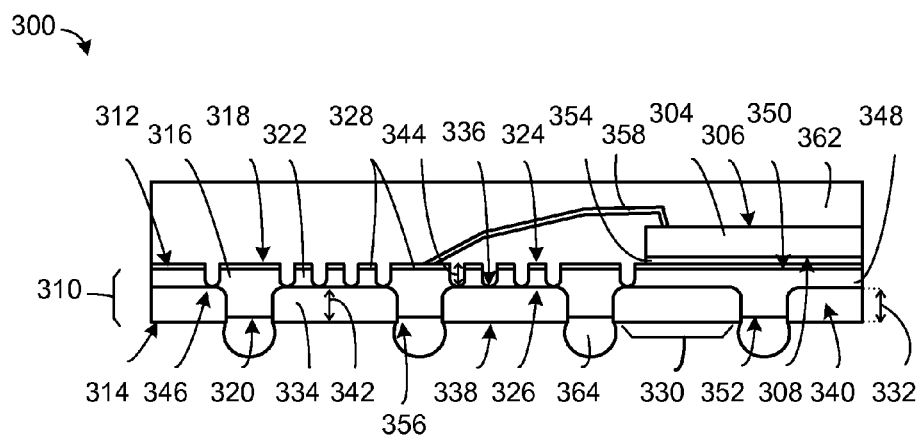
FIG. 3 is a cross-sectional view of an integrated circuit packaging system in a third embodiment of the present invention.

Referring now to FIG. 3, therein is shown a cross-sectional view of an integrated circuit packaging system 300 in a third embodiment of the present invention. The integrated circuit packaging system 300 can include a die 304 mounted over a leadframe 310. The die 304 can include a wirebond die.

The integrated circuit packaging system 300 can be formed by selectively etching portions of the leadframe 310. The leadframe 310 is a metal structure. The leadframe 310 can be used to form other conductive elements. The leadframe 310 can refer to the resulting conductive elements.

Etching is a process for removing material. Etching can include wet etching, dry etching, reactive ion etching, laser etching, laser ablation, mechanical etching, or a combination thereof.

The leadframe 310 can include a leadframe active side 312 and a leadframe inactive side 314. The leadframe active side 312 is the side having active circuitry fabricated thereon. The leadframe inactive side 314 is the side opposite from the leadframe active side 312.

The integrated circuit packaging system 300 can include lead pads 316. The lead pads 316 are conductive structures providing a conductive path from the leadframe active side 312 to a leadframe inactive side 314. The lead pads 316 can be formed by etching portions of the leadframe 310.

The lead pads 316 can include a lead pad active side 318 and a lead pad inactive side 320. The lead pad active side 318 is the side having active circuitry attached thereon. The lead pad inactive side 320 is the side opposite from the lead pad active side 318.

The integrated circuit packaging system 300 can include routable traces 322. The routable traces 322 are conductive structures for forming a conductive path. For example, the routable traces 322 can be used to form a conductive path from the die 304 to the lead pads 316. The routable traces 322 can be formed on the leadframe active side 312.

The routable traces 322 can include a trace top side 324 and a trace bottom side 326. The trace top side 324 is the side having active circuitry attached thereon. The trace bottom side 326 is the side opposite from the trace top side 324.

The routable traces 322 can include a conductive layer 328 on the leadframe active side 312. The conductive layer 328 is a thin layer of conductive material formed on the routable traces 322 to increase conductivity. For example, the conductive layer 328 can include a copper layer, a pre-plated leadframe layer, a metal layer, or a combination thereof.

The die 304 can be electrically connected to the lead pads 316 with internal interconnects 358. The internal interconnects 358 are electrically conductive elements. For example, the internal interconnects 358 can be a bond wires, leads, or a combination thereof.

The integrated circuit packaging system 300 can include the leadframe 310 having an overmold recess 330 formed on the leadframe inactive side 314. The overmold recess 330 can be formed by half-etching the leadframe 310. The recess can be formed directly below the routable traces 322 and between the lead pads 316. The overmold recess 330 has an overmold height 332. The overmold height 332 is the thickness of the overmold recess 330.

The overmold recess 330 can be etched to an overmold recess depth 342. For example, the overmold recess 330 can be formed by etching the leadframe 310 using a deep half etch process.

The integrated circuit packaging system 300 can include an overmold layer 334 formed within the overmold recess 330 in the leadframe 310. The overmold layer 334 is an electrically insulating structure.

The overmold layer 334 can include an overmold inner side 336 and an overmold outer side 338. The overmold outer side 338 is the side of the overmold layer 334 facing away from the leadframe 310. The overmold inner side 336 is the side of the overmold layer 334 facing toward the leadframe 310. The overmold outer side 338 can be coplanar with the lead pad inactive side 320.

The overmold layer 334 can act as an etch stop 346 when forming the lead pads 316 and the routable traces 322. The etch stop 346 is a structure for limiting further etching. The etch stop 346, such as the overmold layer 334, can provide precise control over the amount of etching performed.

The overmold layer 334 is formed with an overmold material 340, such as a resin, epoxy, polymer, or a combination thereof. The overmold material 340 is a substance that is electrically insulating and etch resistant.

For example, the overmold layer 334 can be formed directly on the trace bottom side 326. The routable traces 322 can be formed by etching portions of the leadframe 310 directly adjacent to the routable traces 322 down to the overmold inner side 336. Etching the leadframe 310 down to the overmold layer 334 allows a trace height 344 of the routable traces 322 to be precisely controlled.

The integrated circuit packaging system 300 can include a die paddle 348. The die paddle 348 is a structure for supporting an electrical component. The die paddle 348 can be formed by etching the leadframe 310. The conductive layer 328 is directly on and over the die paddle 348.

The die paddle 348 can include a die paddle top side 350 and a die paddle bottom side 352. The die paddle top side 350 is the side having active circuitry attached thereon. The die paddle bottom side 352 is the side opposite from the die paddle top side 350.

The integrated circuit packaging system 300 can include the die 304 mounted over the die paddle 348. The die 304 is an active microelectronic component. For example, the die 304 can be an integrated circuit, a processor, a microelectromechanical element, a flipchip, a leadless package, or a combination thereof.

The integrated circuit packaging system 300 can include a die top side 306 and a die bottom side 308. The die top side 306 is the side of the die 304 facing away from the leadframe 310. The die bottom side 308 is the side of the die 304 opposite of the die top side 306.

The die 304 can be mounted over the die paddle 348 with an adhesive layer 354. The adhesive layer 354 is a structure for attaching objects together. The adhesive layer 354 can be a polymer, epoxy, or combination thereof.

The integrated circuit packaging system 300 can include an encapsulation 362 formed directly on and over the lead pads 316, the routable traces 322, and the die 304. The encapsulation 362 can be directly on the conductive layer 328, the lead pads 316, the routable traces 322, the overmold layer 334, the die 304, the internal interconnects 358, the adhesive layer 354, and the die paddle 348. The encapsulation can be between one of the routable traces 322 and another one of the routable traces 322.

The integrated circuit packaging system 300 can include a lead recess 356 at the lead pad inactive side 320. The lead recess 356 is formed at the lead pad inactive side 320 and between adjacent ones of the overmold layer 334.

The integrated circuit packaging system 300 can include external interconnects 364 attached to the lead pads 316 on the lead pad inactive side 320. The external interconnects 364 are electrically conductive structures for forming connections to external systems (not shown). For example, the external interconnects 364 can be solder balls, solder bumps, solder posts, or a combination thereof. The external interconnects 364 can be formed in the lead recess 356.

It has been discovered that forming the routable traces 322 over the overmold layer 334 increases quality and improves reliability. Forming the routable traces 322 by etching the leadframe 310 down to the overmold layer 334 provides precise control over the dimensions of the routable traces 322 and reduce the likelihood of incomplete etching causing short circuits.

It has been discovered that forming the overmold layer 334 within the overmold recess 330 formed by half-etching the leadframe 310 increases manufacturing yield and reduces error rates. Forming the overmold recess 330 to a precise depth with the half-etch process allows the overmold layer 334 to act as the etch stop 346 to more accurately control the trace height 344 of the routable traces 322.

Figure 4:
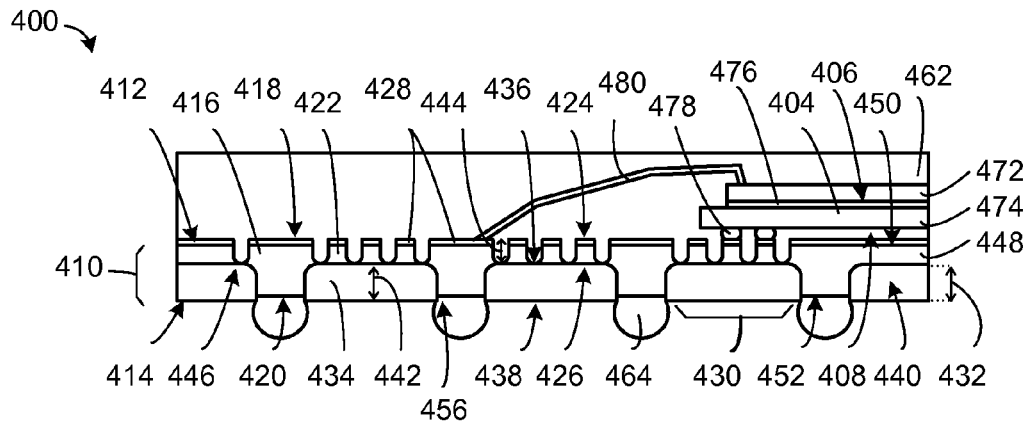
FIG. 4 is a cross-sectional view of an integrated circuit packaging system in a fourth embodiment of the present invention.

Referring now to FIG. 4, therein is shown a cross-sectional view of an integrated circuit packaging system 400 in a fourth embodiment of the present invention. The integrated circuit packaging system 400 can include a die 404 mounted over a leadframe 410.

The die 404 can include a hybrid chip. The hybrid chip can include a lower chip 474 and an upper chip 472. For example, the lower chip 474 can include a flip chip and the upper chip 472 can include a wirebond die. The lower chip 474 and the upper chip 472 can be attached with a die adhesive 476. The die adhesive 476 is a material for holding two elements together. The die adhesive 476 can be a polymer, epoxy, or combination thereof.

Etching is a process for removing material. Etching can include wet etching, dry etching, reactive ion etching, laser etching, laser ablation, mechanical etching, or a combination thereof.

The integrated circuit packaging system 400 can be formed by selectively etching portions of the leadframe 410. The leadframe 410 is a metal structure. The leadframe 410 can be used to form other conductive elements. The leadframe 410 can refer to the resulting conductive elements.

The leadframe 410 can include a leadframe active side 412 and a leadframe inactive side 414. The leadframe active side 412 is the side having active circuitry fabricated thereon. The leadframe inactive side 414 is the side opposite from the leadframe active side 412.

The integrated circuit packaging system 400 can include lead pads 416. The lead pads 416 are conductive structures providing a conductive path from the leadframe active side 412 to a leadframe inactive side 414. The lead pads 416 can be formed by etching portions of the leadframe 410.

The lead pads 416 can include a lead pad active side 418 and a lead pad inactive side 420. The lead pad active side 418 is the side having active circuitry attached thereon. The lead pad inactive side 420 is the side opposite from the lead pad active side 418.

The integrated circuit packaging system 400 can include routable traces 422. The routable traces 422 are conductive structures for forming a conductive path. For example, the routable traces 422 can be used to form a conductive path from the die 404 to the lead pads 416. The routable traces 422 can be formed on the leadframe active side 412.

The routable traces 422 can include a trace top side 424 and a trace bottom side 426. The trace top side 424 is the side having active circuitry attached thereon. The trace bottom side 426 is the side opposite from the trace top side 424.

The routable traces 422 can include a conductive layer 428 on the leadframe active side 412. The conductive layer 428 is a thin layer of conductive material formed on the routable traces 422 to increase conductivity. For example, the conductive layer 428 can include a copper layer, a pre-plated leadframe layer, a metal layer, or a combination thereof.

The routable traces 422 can be positioned directly below the lower chip 474. The routable traces 422 can be electrically connected to the lower chip 474 with lower interconnects 478. The lower interconnects 478 are an electrically conductive element. For example, the lower interconnects 478 can be a solder ball, solder bump, solder post, or a combination thereof. The lower interconnects 478 can be formed between the die 404 and routable traces 422.

The die 404 can be electrically connected to the lead pads 416 with upper interconnects 480. The upper interconnects 480 are electrically conductive elements. For example, the upper interconnects 480 can be bond wires, leads, or a combination thereof.

The integrated circuit packaging system 400 can include the leadframe 410 having an overmold recess 430 formed on the leadframe inactive side 414. The overmold recess 430 can be formed by half-etching the leadframe 410. The recess can be formed directly below the routable traces 422 and between the lead pads 416. The overmold recess 430 can have an overmold height 432. The overmold height 432 is the thickness of the overmold recess 430.

The overmold recess 430 can be etched to an overmold recess depth 442. For example, the overmold recess 430 can be formed by etching the leadframe 410 using a deep half etch process.

The integrated circuit packaging system 400 can include an overmold layer 434 formed within the overmold recess 430 in the leadframe 410. The overmold layer 434 is an electrically insulating structure.

The overmold layer 434 can include an overmold inner side 436 and an overmold outer side 438. The overmold outer side 438 is the side of the overmold layer 434 facing away from the leadframe 410. The overmold inner side 436 is the side of the overmold layer 434 facing toward the leadframe 410. The overmold outer side 438 can be coplanar with the lead pad inactive side 420.

The overmold layer 434 can act as an etch stop 446 when forming the lead pads 416 and the routable traces 422. The etch stop 446 is a structure for limiting further etching. The etch stop 446, such as the overmold layer 434, can provide precise control over the amount of etching performed.

The overmold layer 434 is formed with an overmold material 440, such as a resin, epoxy, polymer, or a combination thereof. The overmold material 440 is a substance that is electrically insulating and etch resistant.

For example, the overmold layer 434 can be formed directly on the trace bottom side 426. The routable traces 422 can be formed by etching portions of the leadframe 410 directly adjacent to the routable traces 422 down to the overmold inner side 436. Etching the leadframe 410 down to the overmold layer 434 allows a trace height 444 of the routable traces 422 to be precisely controlled.

The integrated circuit packaging system 400 can include a die paddle 448. The die paddle 448 is a structure for supporting an electrical component. The die paddle 448 can be formed by etching the leadframe 410. The conductive layer 428 is directly on and over the die paddle 448.

The die paddle 448 can include a die paddle top side 450 and a die paddle bottom side 452. The die paddle top side 450 is the side having active circuitry attached thereon. The die paddle bottom side 452 is the side opposite from the die paddle top side 450.

The integrated circuit packaging system 400 can include the die 404 mounted over the die paddle 448. The die 404 is an active microelectronic component. For example, the die 404 can be an integrated circuit, a processor, a microelectromechanical element, a flipchip, a leadless package, or a combination thereof.

The integrated circuit packaging system 400 can include a die top side 406 and a die bottom side 408. The die top side 406 is the side of the die 404 facing away from the leadframe 410. The die bottom side 408 is the side of the die 404 opposite of the die top side 406.

The integrated circuit packaging system 400 can include an encapsulation 462 formed directly on and over the lead pads 416, the routable traces 422, and the die 404. The encapsulation 462 can be directly on the conductive layer 428, the lead pads 416, the routable traces 422, the overmold layer 434, the die 404, the upper interconnects 480, the lower interconnect 478, and the die paddle 448. The encapsulation 462 can be between the die 404 and the die paddle 448. The encapsulation 462 can be between one of the routable traces 422 and another one of the routable traces 422.

The integrated circuit packaging system 400 can include a lead recess 456 at the lead pad inactive side 420. The lead recess 456 is formed at the lead pad inactive side 420 and between adjacent ones of the overmold layer 434.

The integrated circuit packaging system 400 can include external interconnects 464 attached to the lead pads 416 on the lead pad inactive side 420. The external interconnects 464 are electrically conductive structures for forming connections to external systems (not shown). For example, the external interconnects 464 can be solder balls, solder bumps, solder posts, or a combination thereof. The external interconnects 464 can be formed in the lead recess 456.

It has been discovered that forming the routable traces 422 over the overmold layer 434 increases quality and improves reliability. Forming the routable traces 422 by etching the leadframe 410 down to the overmold layer 434 provides precise control over the dimensions of the routable traces 422 and reduces the likelihood of incomplete etching causing short circuits.

It has been discovered that forming the overmold layer 434 within the overmold recess 430 formed by half-etching the leadframe 410 increases manufacturing yield and reduces error rates. Forming the overmold recess 430 to a precise depth with the half-etch process allows the overmold layer 434 to act as the etch stop 446 to more accurately control the trace height 444 of the routable traces 422.

Figure 5:
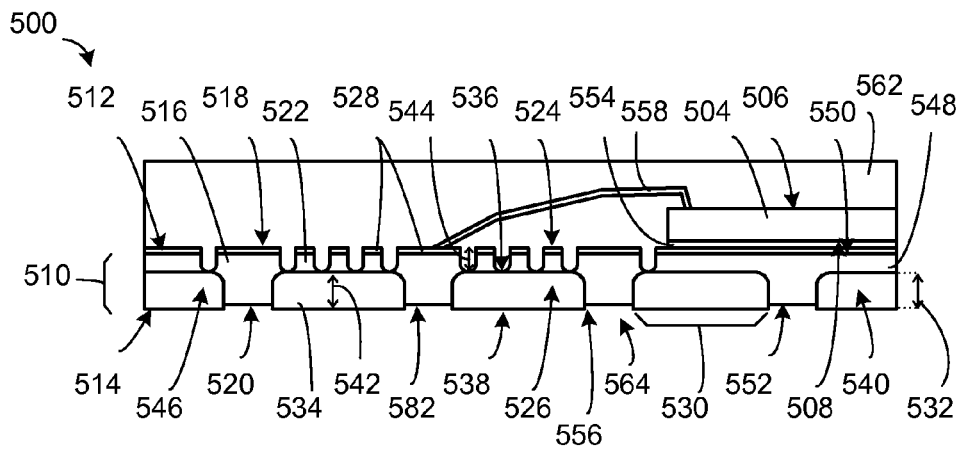
FIG. 5 is a cross-sectional view of an integrated circuit packaging system in a fifth embodiment of the present invention.

Referring now to FIG. 5, therein is shown a cross-sectional view of an integrated circuit packaging system 500 in a fifth embodiment of the present invention. The integrated circuit packaging system 500 can include a die 504 mounted over a leadframe 510. The integrated circuit packaging system 500 can be a leadless package.

The integrated circuit packaging system 500 can be formed by selectively etching portions of the leadframe 510. The leadframe 510 is a metal structure. The leadframe 510 can be used to form other conductive elements. The leadframe 510 can refer to the resulting conductive elements.

Etching is a process for removing material. Etching can include wet etching, dry etching, reactive ion etching, laser etching, laser ablation, mechanical etching, or a combination thereof.

The leadframe 510 can include a leadframe active side 512 and a leadframe inactive side 514. The leadframe active side 512 is the side having active circuitry fabricated thereon. The leadframe inactive side 514 is the side opposite from the leadframe active side 512.

The integrated circuit packaging system 500 can include lead pads 516. The lead pads 516 are conductive structures providing a conductive path from the leadframe active side 512 to a leadframe inactive side 514. The lead pads 516 can be formed by etching portions of the leadframe 510.

The lead pads 516 can include a lead pad active side 518 and a lead pad inactive side 520. The lead pad active side 518 is the side having active circuitry attached thereon. The lead pad inactive side 520 is the side opposite from the lead pad active side 518.

The integrated circuit packaging system 500 can include routable traces 522. The routable traces 522 are conductive structures for forming a conductive path. For example, the routable traces 522 can be used to form a conductive path from the die 504 to the lead pads 516. The routable traces 522 can be formed on the leadframe active side 512.

The routable traces 522 can include a trace top side 524 and a trace bottom side 526. The trace top side 524 is the side having active circuitry attached thereon. The trace bottom side 526 is the side opposite from the trace top side 524.

The routable traces 522 can include a conductive layer 528 on the leadframe active side 512. The conductive layer 528 is a thin layer of conductive material formed on the routable traces 522 to increase conductivity. For example, the conductive layer 528 can include a copper layer, a pre-plated leadframe layer, a metal layer, or a combination thereof.

The die 504 can be electrically connected to the lead pads 516 with internal interconnects 558. The internal interconnects 558 are electrically conductive elements. For example, the internal interconnects 558 can be a bond wires, leads, or a combination thereof.

The integrated circuit packaging system 500 can include the leadframe 510 having an overmold recess 530 formed on the leadframe inactive side 514. The overmold recess 530 can be formed by half-etching the leadframe 510. The recess can be formed directly below the routable traces 522 and between the lead pads 516. The overmold recess 530 have an overmold height 532. The overmold height 532 is the thickness of the overmold recess 530.

The overmold recess 530 can be etched to an overmold recess depth 542. For example, the overmold recess 530 can be formed by etching the leadframe 510 using a deep half etch process.

The integrated circuit packaging system 500 can include an overmold layer 534 formed within the overmold recess 530 in the leadframe 510. The overmold layer 534 is an electrically insulating structure.

The overmold layer 534 can include an overmold inner side 536 and an overmold outer side 538. The overmold outer side 538 is the side of the overmold layer 534 facing away from the leadframe 510. The overmold inner side 536 is the side of the overmold layer 534 facing toward the leadframe 510. The overmold outer side 538 can be coplanar with the lead pad inactive side 520.

The overmold layer 534 can act as an etch stop 546 when forming the lead pads 516 and the routable traces 522. The etch stop 546 is a structure for limiting further etching. The etch stop 546, such as the overmold layer 534, can provide precise control over the amount of etching performed.

The overmold layer 534 is formed with an overmold material 540, such as a resin, epoxy, polymer, or a combination thereof. The overmold material 540 is a substance that is electrically insulating and etch resistant.

For example, the overmold layer 534 can be formed directly on the trace bottom side 526. The routable traces 522 can be formed by etching portions of the leadframe 510 directly adjacent to the routable traces 522 down to the overmold inner side 536. Etching the leadframe 510 down to the overmold layer 534 allows a trace height 544 of the routable traces 522 to be precisely controlled.

The integrated circuit packaging system 500 can include a die paddle 548. The die paddle 548 is a structure for supporting an electrical component. The die paddle 548 can be formed by etching the leadframe 510. The conductive layer 528 is directly on and over the die paddle 548.

The die paddle 548 can include a die paddle top side 550 and a die paddle bottom side 552. The die paddle top side 550 is the side having active circuitry attached thereon. The die paddle bottom side 552 is the side opposite from the die paddle top side 550.

The integrated circuit packaging system 500 can include the die 504 mounted over the die paddle 548. The die 504 is an active microelectronic component. For example, the die 504 can be an integrated circuit, a processor, a microelectromechanical element, a flipchip, a leadless package, or a combination thereof.

The integrated circuit packaging system 500 can include a die top side 506 and a die bottom side 508. The die top side 506 is the side of the die 504 facing away from the leadframe 510. The die bottom side 508 is the side of the die 504 opposite of the die top side 506.

The die 504 can be mounted over the die paddle 548 with an adhesive layer 554. The adhesive layer 554 is a structure for attaching objects together. The adhesive layer 554 can be a polymer, epoxy, or combination thereof.

The integrated circuit packaging system 500 can include an encapsulation 562 formed directly on and over the lead pads 516, the routable traces 522, and the die 504. The encapsulation 562 can be directly on the conductive layer 528, the lead pads 516, the routable traces 522, the overmold layer 534, the die 504, the internal interconnects 558, and the die paddle 548. The encapsulation can be between one of the routable traces 522 and another one of the routable traces 522.

The integrated circuit packaging system 500 can include the overmold layer 534 below the lead pad inactive side 520 forming a lead recess 556. The lead recess 556 is bounded by the lead pad inactive side 520 and the nearest ones of the overmold layer 534. For example, the lead recess 556 can be part of a land grid array (LGA) package. The lead recess 556 is formed without the conductive layer 528 on the lead pad inactive side 520.

The lead recess 556 can be one of the external interconnects 564. The lead recess 556 can be for forming electrical connections to external systems (not shown). A leadless connector 582 can be formed by exposing the conductive layer 528 at the lead pad inactive side 520. The leadless connector 582 is an electrically conductive structure. The leadless connector 582 is coplanar with the overmold outer side 538.

It has been discovered that forming the routable traces 522 over the overmold layer 534 increases quality and improves reliability. Forming the routable traces 522 by etching the leadframe 510 down to the overmold layer 534 provides precise control over the dimensions of the routable traces 522 and reduce the likelihood of incomplete etching causing short circuits.

It has been discovered that forming the overmold layer 534 within the overmold recess 530 formed by half-etching the leadframe 510 increases manufacturing yield and reduces error rates. Forming the overmold recess 530 to a precise depth with the half-etch process allows the overmold layer 534 to act as the etch stop 546 to more accurately control the trace height 544 of the routable traces 522.

Figure 6:
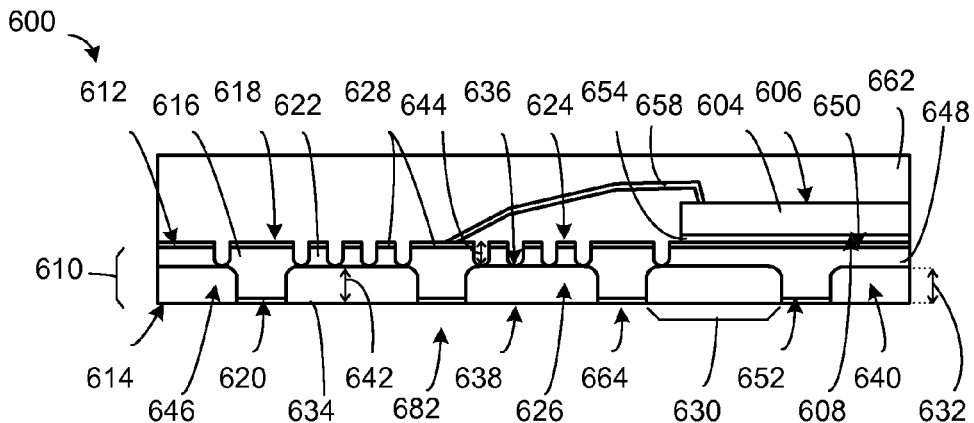
FIG. 6 is a cross-sectional view of an integrated circuit packaging system in a sixth embodiment of the present invention.

Referring now to FIG. 6, therein is shown a cross-sectional view of an integrated circuit packaging system 600 in a sixth embodiment of the present invention. The integrated circuit packaging system 600 can include a die 604 mounted over a leadframe 610. The integrated circuit packaging system 600 can be a leadless package.

The integrated circuit packaging system 600 can be formed by selectively etching portions of the leadframe 610. The leadframe 610 is a metal structure. The leadframe 610 can be used to form other conductive elements. The leadframe 610 can refer to the resulting conductive elements.

Etching is a process for removing material. Etching can include wet etching, dry etching, reactive ion etching, laser etching, laser ablation, mechanical etching, or a combination thereof.

The leadframe 610 can include a leadframe active side 612 and a leadframe inactive side 614. The leadframe active side 612 is the side having active circuitry fabricated thereon. The leadframe inactive side 614 is the side opposite from the leadframe active side 612.

The integrated circuit packaging system 600 can include lead pads 616. The lead pads 616 are conductive structures providing a conductive path from the leadframe active side 612 to a leadframe inactive side 614. The lead pads 616 can be formed by etching portions of the leadframe 610.

The lead pads 616 can include a lead pad active side 618 and a lead pad inactive side 620. The lead pad active side 618 is the side having active circuitry attached thereon. The lead pad inactive side 620 is the side opposite from the lead pad active side 618.

The integrated circuit packaging system 600 can include routable traces 622. The routable traces 622 are conductive structures for forming a conductive path. For example, the routable traces 622 can be used to form a conductive path from the die 604 to the lead pads 616. The routable traces 622 can be formed on the leadframe active side 612.

The routable traces 622 can include a trace top side 624 and a trace bottom side 626. The trace top side 624 is the side having active circuitry attached thereon. The trace bottom side 626 is the side opposite from the trace top side 624.

The routable traces 622 can include a conductive layer 628 on the leadframe active side 612. The conductive layer 628 is a thin layer of conductive material formed on the routable traces 622 to increase conductivity. For example, the conductive layer 628 can include a copper layer, a pre-plated leadframe layer, a metal layer, or a combination thereof.

The die 604 can be electrically connected to the lead pads 616 with internal interconnects 658. The internal interconnects 658 are electrically conductive elements. For example, the internal interconnects 658 can be a bond wires, leads, or a combination thereof.

The integrated circuit packaging system 600 can include the leadframe 610 having an overmold recess 630 formed on the leadframe inactive side 614. The overmold recess 630 can be formed by half-etching the leadframe 610. The recess can be formed directly below the routable traces 622 and between the lead pads 616. The overmold recess 630 have an overmold height 632. The overmold height 632 is the thickness of the overmold recess 630.

The overmold recess 630 can be etched to an overmold recess depth 642. For example, the overmold recess 630 can be formed by etching the leadframe 610 using a deep half etch process.

The integrated circuit packaging system 600 can include an overmold layer 634 formed within the overmold recess 630 in the leadframe 610. The overmold layer 634 is an electrically insulating structure.

The overmold layer 634 can include an overmold inner side 636 and an overmold outer side 638. The overmold outer side 638 is the side of the overmold layer 634 facing away from the leadframe 610. The overmold inner side 636 is the side of the overmold layer 634 facing toward the leadframe 610. The overmold outer side 638 can be coplanar with the lead pad inactive side 620.

The overmold layer 634 can act as an etch stop 646 when forming the lead pads 616 and the routable traces 622. The etch stop 646 is a structure for limiting further etching. The etch stop 646, such as the overmold layer 634, can provide precise control over the amount of etching performed.

The overmold layer 634 is formed with an overmold material 640, such as a resin, epoxy, polymer, or a combination thereof. The overmold material 640 is a substance that is electrically insulating and etch resistant.

For example, the overmold layer 634 can be formed directly on the trace bottom side 626. The routable traces 622 can be formed by etching portions of the leadframe 610 directly adjacent to the routable traces 622 down to the overmold inner side 636. Etching the leadframe 610 down to the overmold layer 634 allows a trace height 644 of the routable traces 622 to be precisely controlled.

The integrated circuit packaging system 600 can include a die paddle 648. The die paddle 648 is a structure for supporting an electrical component. The die paddle 648 can be formed by etching the leadframe 610.

The die paddle 648 can include the conductive layer 628 directly on and over a die paddle top side 650 and a die paddle bottom side 652. The die paddle top side 650 is the side having active circuitry attached thereon. The die paddle bottom side 652 is the side opposite from the die paddle top side 650.

The integrated circuit packaging system 600 can include the die 604 mounted over the die paddle 648. The die 604 is an active microelectronic component. For example, the die 604 can be an integrated circuit, a processor, a microelectromechanical element, a flipchip, a leadless package, or a combination thereof.

The integrated circuit packaging system 600 can include a die top side 606 and a die bottom side 608. The die top side 606 is the side of the die 604 facing away from the leadframe 610. The die bottom side 608 is the side of the die 604 opposite of the die top side 606.

The die 604 can be mounted over the die paddle 648 with an adhesive layer 654. The adhesive layer 654 is a structure for attaching objects together. The adhesive layer 654 can be a polymer, epoxy, or combination thereof.

The integrated circuit packaging system 600 can include an encapsulation 662 formed directly on and over the lead pads 616, the routable traces 622, and the die 604. The encapsulation 662 can be directly on the conductive layer 628, the lead pads 616, the routable traces 622, the overmold layer 634, the die 604, the internal interconnects 658, and the die paddle 648. The encapsulation can be between one of the routable traces 622 and another one of the routable traces 622.

The lead pads 616 can include the conductive layer 628 formed at the lead pad inactive side 620. The conductive layer 628 can be coplanar with the overmold outer side 638. For example, the lead pads 616 having the conductive layer 628 on the lead pad inactive side 620 can form a portion of a land grid array package.

The lead pads 616 and the conductive layer 628 at the lead pad inactive side 620 can act as external interconnects 664 for forming electrical connections to external systems (not shown). A leadless connector 682 can be formed by exposing the conductive layer 628 at the lead pad inactive side 620. The leadless connector 682 is an electrically conductive structure. The leadless connector 682 is coplanar with the overmold outer side 638.

It has been discovered that forming the routable traces 622 over the overmold layer 634 increases quality and improves reliability. Forming the routable traces 622 by etching the leadframe 610 down to the overmold layer 634 provides precise control over the dimensions of the routable traces 622 and reduces the likelihood of incomplete etching causing short circuits.

It has been discovered that forming the overmold layer 634 within the overmold recess 630 formed by half-etching the leadframe 610 increases manufacturing yield and reduces error rates. Forming the overmold recess 630 to a precise depth with the half-etch process allows the overmold layer 634 to act as the etch stop 646 to more accurately control the trace height 644 of the routable traces 622.

Figure 7:
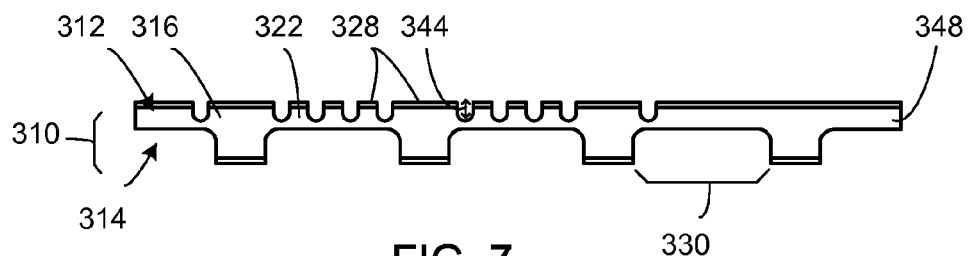
FIG. 7 is the structure of FIG. 3 in a provisioning phase of manufacturing.

Referring now to FIG. 7, therein is shown the structure of FIG. 3 in a provisioning phase of manufacturing. The provisioning phase can include a forming method to partially etch the leadframe active side 312 of the leadframe 310 to form upper portions of the lead pads 316, the routable traces 322, and the die paddle 348.

The leadframe 310 can be plated with the conductive layer 328. The leadframe 310 can include the conductive layer 328 on the leadframe active side 312. The leadframe 310 can include another of the conductive layer 328 on the leadframe inactive side 314. For example, the conductive layer 328 can be a portion of a pre-plated leadframe (PPF).

The conductive layer 328 can be formed directly on the leadframe 310 to increase conductivity. For example, the conductive layer 328 can be a layer of copper formed over the leadframe active side 312 or the leadframe inactive side 314.

The upper portions of the lead pads 316, the routable traces 322, and the die paddle 348 can be formed by partially etching the leadframe active side 312 including the conductive layer 328. The leadframe 310 can be etched by forming a protective mask (not shown) defining the location of the lead pads 316, the routable traces 322, and the die paddle 348 and then removing portions of the unprotected areas of the leadframe 310 with an etching process. The etching process can include a chemical etch, reactive ion beam etching, laser etching, or a combination thereof.

The leadframe 310 can include the overmold recess 330 formed at the leadframe inactive side 314. The overmold recess 330 can be formed by half-etching the leadframe 310 using a precision etching process having high resolution control over the depth of the etching. The overmold recess 330 can be formed directly under the routable traces 322 to facilitate the formation of the routable traces 322 that is electrically isolated from other elements.

The overmold recess 330 can be formed through the conductive layer 328 at the leadframe inactive side 314. The overmold recess 330 can be formed though a portion of the leadframe 310 at the leadframe inactive side 314.

The provisioning phase can form the leadframe 310 or simply provide the leadframe 310 as a pre-formed component. For example, the leadframe 310 can be provisioned in the manufacturing process as a completed component ready for the next phase of manufacturing.

It has been discovered forming the overmold recess 330 directly under the routable traces 322 can increase manufacturing yield and reduce error rates. By forming the overmold recess 330 under the routable traces 322, the trace height 344 can be precisely controlled by controlling the depth of the overmold recess 330. Forming the routable traces 322 with the trace height 344 controlled reduces errors and provides a higher manufacturing yield by eliminating sizing errors.

Figure 8:
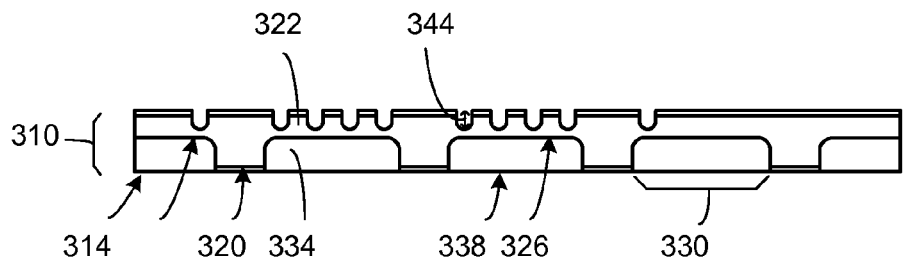
FIG. 8 is the structure of FIG. 7 in an overmolding phase of manufacturing.

Referring now to FIG. 8, therein is shown the structure of FIG. 7 in an overmolding phase of manufacturing. The overmolding phase can include an overmolding method to form the overmold layer 334 in the overmold recess 330 of the leadframe 310.

The overmold layer 334 can be formed within the overmold recess 330 at the leadframe inactive side 314. The overmold layer 334 is on and in direct contact with the overmold recess 330 and the trace bottom side 326.

The overmold outer side 338 can be coplanar with the leadframe inactive side 314 and the lead pad inactive side 320. The overmold layer 334 can act as an etch stop layer when etching the routable traces 322 allowing precise control over the trace height 344.

Figure 9:
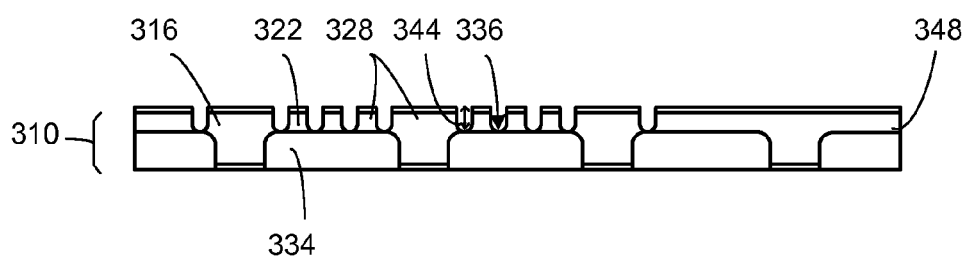
FIG. 9 is the structure of FIG. 8 in a full etch phase of manufacturing.

Referring now to FIG. 9, therein is shown the structure of FIG. 8 in a full etch phase of manufacturing. The full etch phase can include a full etch method for removing a portion of the leadframe 310 for the integrated circuit packaging system 300 of FIG. 3.

The full etch method can be performed in a variety of ways. For example, the full etch method can include chemical etch, dry etch, reactive ion etching, laser etching, or a combination thereof.

The leadframe 310 can be etched to selectively separate the lead pads 316, the routable traces 322, and the die paddle 348. The full etch method can remove material in the areas of the leadframe 310 that were partially etched.

The full etch phase can include using a protective mask to protect the lead pads 316, the routable traces 322, and the die paddle 348. The etch mask can include the conductive layer 328, a etch mask, or a combination thereof. The areas unprotected by the protective mask can be removed by the full etch method.

The removal process can remove material from the areas unprotected by the protective mask until the overmold inner side 336 is reached. The overmold layer 334 can act as an etch stop layer and allow the routable traces 322 to be formed having the trace height 344 precisely controlled. When the routable traces 322 are completely isolated from the residual portions of the leadframe 310, the routable traces 322 can be supported by the overmold layer 334.

Figure 10:
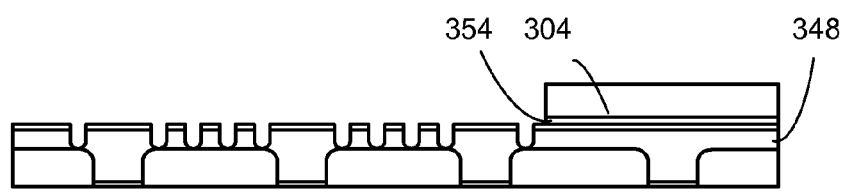
FIG. 10 is the structure of FIG. 9 in an attaching phase of manufacturing.

Referring now to FIG. 10, therein is shown the structure of FIG. 9 in an attaching phase of manufacturing. The attaching phase can include a die attach method to mount the die 304 over the die paddle 348 for the integrated circuit packaging system 300 of FIG. 3.

The die 304 can be mounted over the die paddle 348 with the adhesive layer 354. The die 304 can be mounted with the active side of the die 304 facing away from the die paddle 348 and the adhesive layer 354.

The adhesive layer 354 can be an epoxy, tape, resin, or a combination thereof. The adhesive layer 354 can be thermally conductive for dissipating heat from the die 304. The adhesive layer 354 can be electrically insulating for preventing short circuits.

The die 304 can be a variety of semiconductor components. For example, the die 304 can be a flipchip, a wire bond chip, a hybrid chip, a leadless package, or a combination thereof.

Figure 11:
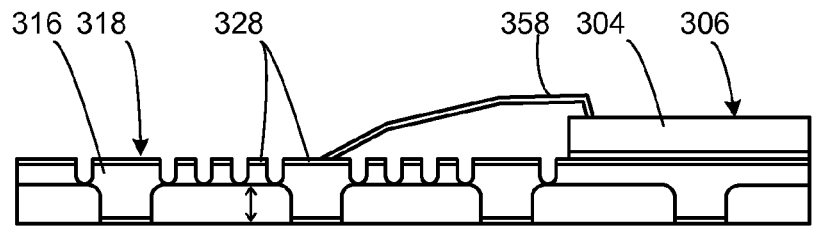
FIG. 11 is the structure of FIG. 10 in a connecting phase of manufacturing.

Referring now to FIG. 11, therein is shown the structure of FIG. 10 in a connecting phase of manufacturing. The connecting phase can include a connecting method for attaching the internal interconnects 358 between the die 304 and the lead pads 316.

The connecting phase can include attaching the internal interconnects 358 to the die 304 and to the lead pads 316. For example, the internal interconnects 358 can be a bond wire, lead, solder ball, trace, or a combination thereof.

The internal interconnects 358 can be attached to the die top side 306. The internal interconnects 358 can be attached to the conductive layer 328 on the lead pad active side 318.

Figure 12:
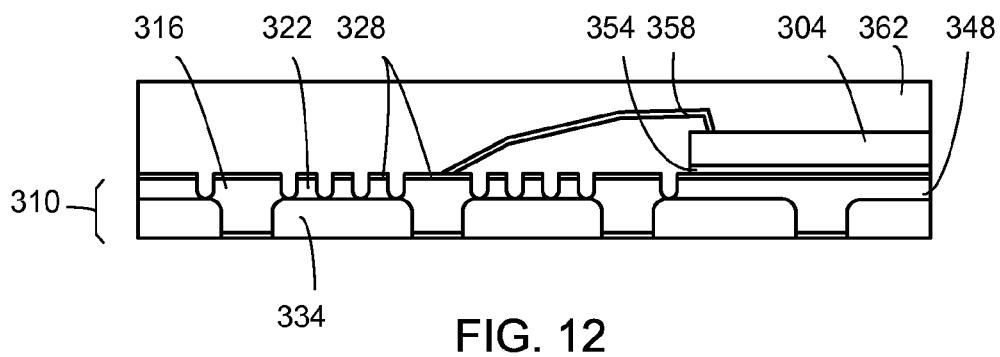
FIG. 12 is the structure of FIG. 11 in an applying phase of manufacturing.

Referring now to FIG. 12, therein is shown the structure of FIG. 11 in an applying phase of manufacturing. The applying phase can include an application method for applying the encapsulation 362 on and over the leadframe 310.

The encapsulation 362 can be applied directly on the lead pads 316, the routable traces 322, the overmold layer 334, the internal interconnects 358, the conductive layer 328, the die 304, and the adhesive layer 354. The encapsulation 362 can electrically isolate the lead pads 316, the routable traces 322, the die 304, the internal interconnects 358, and the die paddle 348. The encapsulation 362 can be an insulating material for preventing short circuits between conductive elements.

Figure 13:
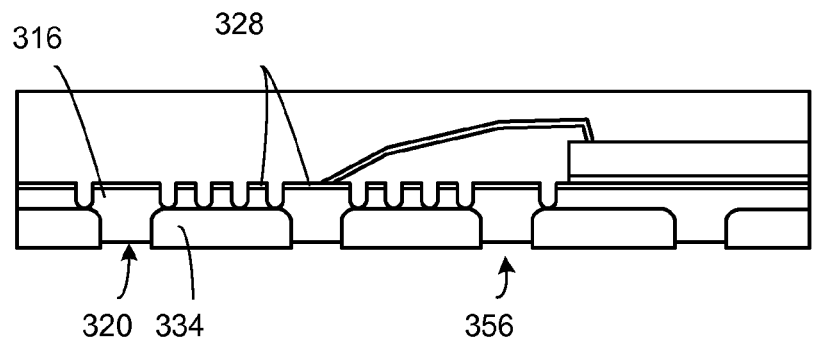
FIG. 13 is the structure of FIG. 12 in a bottom etching phase of manufacturing.

Referring now to FIG. 13, therein is shown the structure of FIG. 12 in a bottom etching phase of manufacturing. The bottom etching phase can include a bottom etch method for removing the conductive layer 328 at the lead pad inactive side 320 and portions of the lead pads 316 to form the lead recess 356.

The bottom etching phase can remove a portion of the conductive layer 328 and a portion of the lead pads 316 on the lead pad inactive side 320 to form the lead recess 356. The lead recess 356 is formed at the lead pad inactive side 320 and between adjacent ones of the overmold layer 334.

The bottom etching method can be implemented in a variety of ways. For example, the bottom etching method can include wet etching, dry etching, reactive ion etching, laser etching, laser ablation, grinding, buffing, or a combination thereof.

Figure 14:
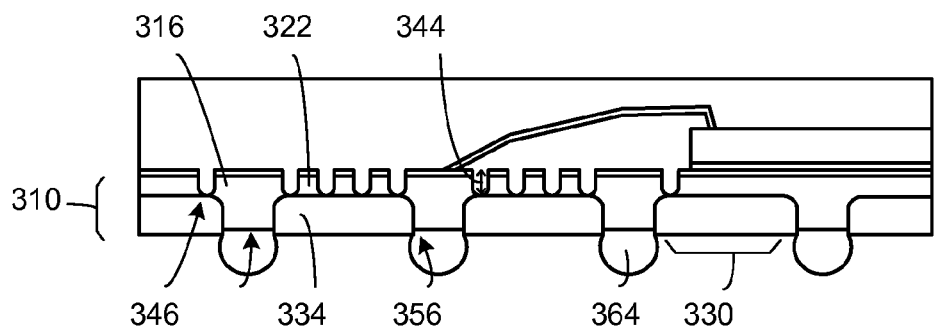
FIG. 14 is the structure of FIG. 13 in an external interconnect phase of manufacturing.

Referring now to FIG. 14, therein is shown the structure of FIG. 13 in an external interconnect phase of manufacturing. The external interconnect phase can include an external interconnect method for attaching the external interconnects 364 to the lead recess 356. The lead recess 356 can provide an electrically conductive location for attaching the external interconnects 364. Positioning the external interconnects 364 within the lead recess 356 can form a mold lock with the overmold layer 334.

It has been discovered that forming the external interconnects 364 within the lead recess 356 and surrounded by the overmold layer 334 can increase manufacturing yield and reduce errors. The external interconnects 364 within the lead recess 356 forms a horizontal mold lock to impede horizontal motion and reduce the likelihood of separation.

It has been discovered that etching between the lead pads 316 and the routable traces 322 until reaching the etch stop 346 provided by the overmold layer 334 in the overmold recess 330 provides increased manufacturing yield and reduced error rates. Etching until the overmold layer 334 provides an improved etching process with precise control over the depth of etching and the trace height 344, thus reducing size errors and allowing improved control over the conductivity of the routable traces 322.

It has been discovered that forming the overmold layer 334 within the overmold recess 330 formed by half-etching the leadframe 310 increases manufacturing yield and reduces error rates. Forming the overmold recess 330 to a precise depth with the half-etch process allows the overmold layer 334 to act as the etch stop 346 to more accurately control the trace height 344 of the routable traces 322.

Figure 15:
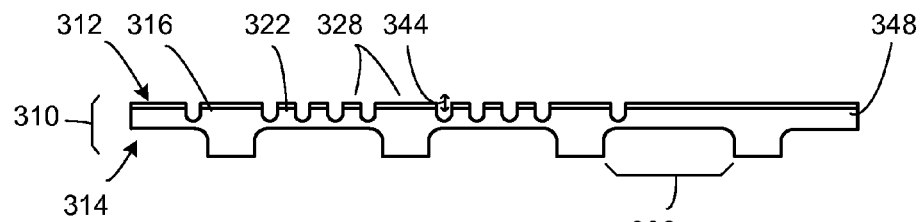
FIG. 15 is the structure of FIG. 3 in a provisioning phase of manufacturing.

Referring now to FIG. 15, therein is shown the structure of FIG. 3 in a provisioning phase of manufacturing. The provisioning phase can include a forming method to partially etch the leadframe active side 312 of the leadframe 310 to form upper portions of the lead pads 316, the routable traces 322, and the die paddle 348.

The leadframe 310 can be plated with the conductive layer 328. The leadframe 310 can include the conductive layer 328 on the leadframe active side 312 and not on the leadframe inactive side 314. For example, the conductive layer 328 can be a portion of a pre-plated leadframe (PPF).

The leadframe 310 can be plated with the conductive layer 328. The conductive layer 328 can be formed directly on the leadframe 310 to increase conductivity. For example, the conductive layer 328 can be a layer of copper formed over the leadframe active side 312.

The upper portions of the lead pads 316, the routable traces 322, and the die paddle 348 can be formed by partially etching the leadframe active side 312 including the conductive layer 328. The leadframe 310 can be etched by forming a protective mask (not shown) defining the location of the lead pads 316, the routable traces 322, and the die paddle 348 and then removing portions of the unprotected areas of the leadframe 310 with an etching process. The etching process can include a chemical etch, reactive ion beam etching, laser etching, or a combination thereof.

The leadframe 310 can include the overmold recess 330 formed at the leadframe inactive side 314. The overmold recess 330 can be formed by half-etching the leadframe 310 using a precision etching process having high resolution control over the depth of the etching. The overmold recess 330 can be formed directly under the routable traces 322 to facilitate the formation of the routable traces 322 that is electrically isolated from other elements.

The provisioning phase can form the leadframe 310 or simply provide the leadframe 310 as a pre-formed component. For example, the leadframe 310 can be provisioned in the manufacturing process as a completed component ready for the next phase of manufacturing.

It has been discovered forming the overmold recess 330 directly under the routable traces 322 can increase manufacturing yield and reduce error rates. By forming the overmold recess 330 under the routable traces 322, the trace height 344 can be precisely controlled by controlling the depth of the overmold recess 330. Forming the routable traces 322 with the trace height 344 controlled reduces errors and provides a higher manufacturing yield by eliminating sizing errors.

Figure 16:
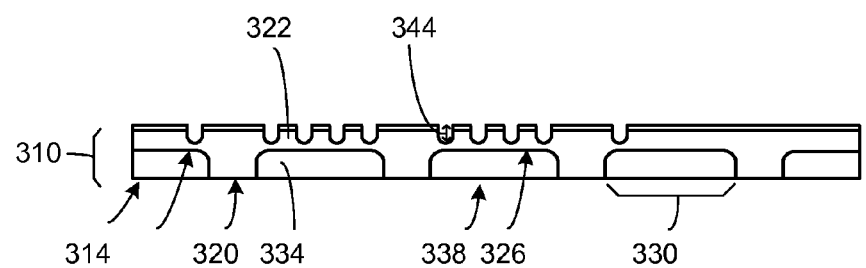
FIG. 16 is the structure of FIG. 15 in an overmolding phase of manufacturing.

Referring now to FIG. 16, therein is shown the structure of FIG. 15 in an overmolding phase of manufacturing. The overmolding phase can include an overmolding method to form the overmold layer 334 in the overmold recess 330 of the leadframe 310.

The overmold layer 334 can be formed within the overmold recess 330 at the leadframe inactive side 314. The overmold layer 334 is on and in direct contact with the overmold recess 330 and the trace bottom side 326.

The overmold outer side 338 can be coplanar with the leadframe inactive side 314 and the lead pad inactive side 320. The overmold layer 334 can act as an etch stop layer when etching the routable traces 322 allowing precise control over the trace height 344. The overmold outer side 338 can be coplanar with the lead pad inactive side 320.

Figure 17:
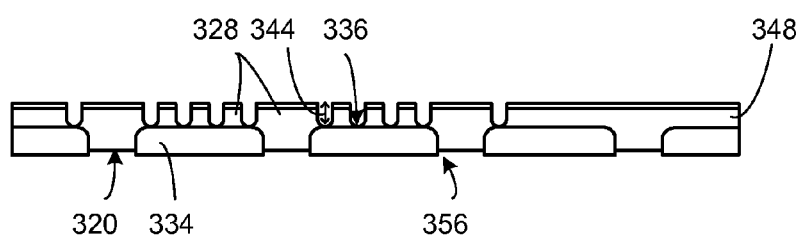
FIG. 17 is the structure of FIG. 16 in a full etch phase of manufacturing.

Referring now to FIG. 17, therein is shown the structure of FIG. 16 in a full etch phase of manufacturing. The full etch phase can include a full etch method for removing a portion of the leadframe 310 for the integrated circuit packaging system 300 of FIG. 3.

The full etch method can be performed in a variety of ways. For example, the full etch method can include chemical etch, dry etch, reactive ion etching, laser etching, or a combination thereof.

The leadframe 310 can be etched to selectively separate the lead pads 316, the routable traces 322, and the die paddle 348. The full etch method can remove material in the areas of the leadframe 310 that were partially etched.

The full etch phase can include using a protective mask to protect the lead pads 316, the routable traces 322, and the die paddle 348. The etch mask can include the conductive layer 328, a protective mask, or a combination thereof. The areas unprotected by the etch mask can be removed by the full etch method.

The removal process can remove material from the areas unprotected by the etch mask until the overmold inner side 336 is reached. The overmold layer 334 can act as an etch stop layer and allow the routable traces 322 to be formed having the trace height 344 precisely controlled. When the routable traces 322 are completely isolated from the residual portions of the leadframe 310, the routable traces 322 can be supported by the overmold layer 334. The full etch method can include etching the lead pads 316 on the lead pad inactive side 320 to form the lead recess 356.

Figure 18:
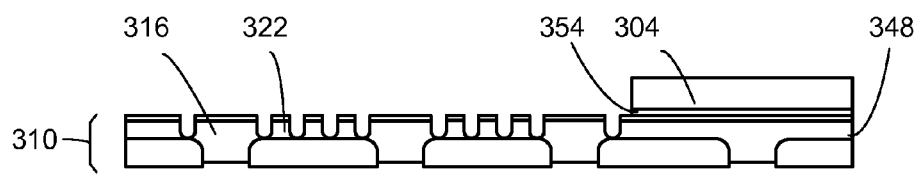
FIG. 18 is the structure of FIG. 17 in an attaching phase of manufacturing.

Referring now to FIG. 18, therein is shown the structure of FIG. 17 in an attaching phase of manufacturing. The attaching phase can include a die attach method to mount the die 304 over the die paddle 348 for the integrated circuit packaging system 300 of FIG. 3.

The die 304 can be mounted over the die paddle 348 with the adhesive layer 354. The die 304 can be mounted with the active side of the die 304 facing away from the die paddle 348 and the adhesive layer 354.

The adhesive layer 354 can be an epoxy, tape, resin, or a combination thereof. The adhesive layer 354 can be thermally conductive for dissipating heat from the die 304. The adhesive layer 354 can be electrically insulating for preventing short circuits.

The die 304 can be a variety of semiconductor components. For example, the die 304 can be a flipchip, a wire bond chip, a hybrid chip, a leadless package, or a combination thereof.

Figure 19:
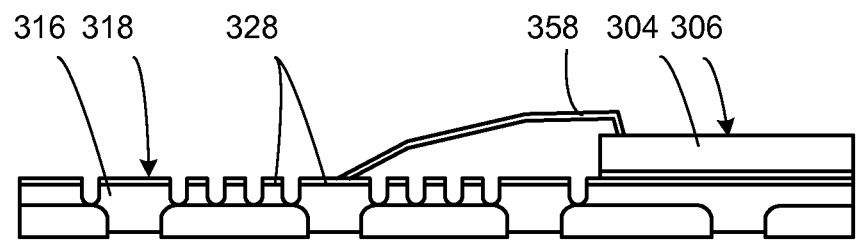
FIG. 19 is the structure of FIG. 18 in a connecting phase of manufacturing.

Referring now to FIG. 19, therein is shown the structure of FIG. 18 in a connecting phase of manufacturing. The connecting phase can include a connecting method for attaching the internal interconnects 358 between the die 304 and the lead pads 316.

The connecting phase can include attaching the internal interconnects 358 to the die 304 and to the lead pads 316. For example, the internal interconnects 358 can be a bond wire, lead, solder ball, trace, or a combination thereof.

The internal interconnects 358 can be attached to the die top side 306. The internal interconnects 358 can be attached to the conductive layer 328 on the lead pad active side 318.

Figure 20:
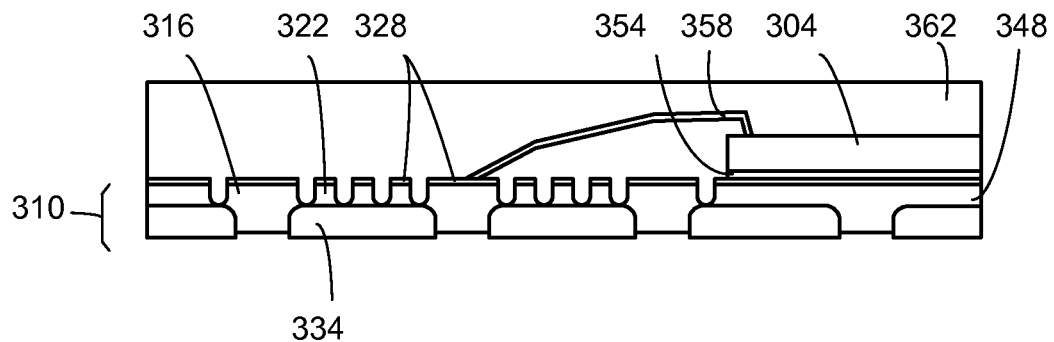
FIG. 20 is the structure of FIG. 19 in an applying phase of manufacturing.

Referring now to FIG. 20, therein is shown the structure of FIG. 19 in an applying phase of manufacturing. The applying phase can include an application method for applying the encapsulation 362 on and over the leadframe 310.

The encapsulation 362 can be applied directly on the lead pads 316, the routable traces 322, the overmold layer 334, the internal interconnects 358, the conductive layer 328, the die 304, and the adhesive layer 354. The encapsulation 362 can electrically isolate the lead pads 316, the routable traces 322, the die 304, the internal interconnects 358, and the die paddle 348. The encapsulation 362 can be an insulating material for preventing short circuits between conductive elements.

Figure 21:
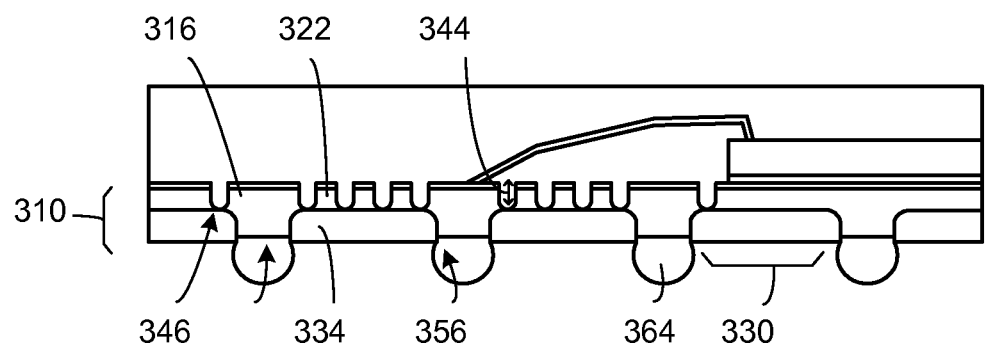
FIG. 21 is the structure of FIG. 20 in an external interconnect phase of manufacturing.

Referring now to FIG. 21, therein is shown the structure of FIG. 20 in an external interconnect phase of manufacturing. The external interconnect phase can include an external interconnect method for attaching the external interconnects 364 to the lead recess 356. The lead recess 356 can provide an electrically conductive location for attaching the external interconnects 364. Positioning the external interconnects 364 within the lead recess 356 can form a mold lock with the overmold layer 334.

It has been discovered that forming the external interconnects 364 within the lead recess 356 and surrounded by the overmold layer 334 can increase manufacturing yield and reduce errors. The external interconnects 364 within the lead recess 356 form a horizontal mold lock to impede horizontal motion and reduce the likelihood of separation.

It has been discovered that etching between the lead pads 316 and the routable traces 322 until reaching the etch stop 346 provided by the overmold layer 334 in the overmold recess 330 provides increased manufacturing yield and reduced error rates. Etching until the overmold layer 334 provides an improved etching process with precise control over the depth of etching and the trace height 344, thus reducing size errors and allowing improved control over the conductivity of the routable traces 322.

It has been discovered that forming the overmold layer 334 within the overmold recess 330 formed by half-etching the leadframe 310 increases manufacturing yield and reduces error rates. Forming the overmold recess 330 to a precise depth with the half-etch process allows the overmold layer 334 to act as the etch stop 346 to more accurately control the trace height 344 of the routable traces 322.

Figure 22:
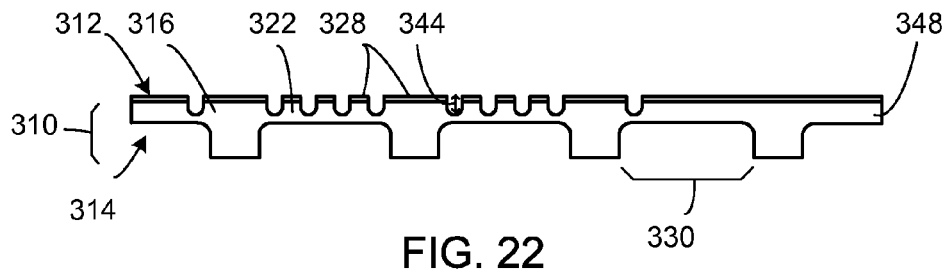
FIG. 22 is the structure of FIG. 3 in a provisioning phase of manufacturing.

Referring now to FIG. 22, therein is shown the structure of FIG. 3 in a provisioning phase of manufacturing. The provisioning phase can include a forming method to partially etch the leadframe active side 312 of the leadframe 310 to form upper portions of the lead pads 316, the routable traces 322, and the die paddle 348.

The leadframe 310 can be plated with the conductive layer 328. The leadframe 310 can include the conductive layer 328 on the leadframe active side 312. The leadframe 310 can include another of the conductive layer 328 on the leadframe inactive side 314. For example, the conductive layer 328 can be a portion of a pre-plated leadframe (PPF).

The conductive layer 328 can be formed directly on the leadframe 310 to increase conductivity. For example, the conductive layer 328 can be a layer of copper formed over the leadframe active side 312 or the leadframe inactive side 314.

The upper portions of the lead pads 316, the routable traces 322, and the die paddle 348 can be formed by partially etching the leadframe active side 312 including the conductive layer 328. The leadframe 310 can be etched by forming a protective mask (not shown) defining the location of the lead pads 316, the routable traces 322, and the die paddle 348 and then removing portions of the unprotected areas of the leadframe 310 with an etching process. The etching process can include a chemical etch, reactive ion beam etching, laser etching, or a combination thereof.

The leadframe 310 can include the overmold recess 330 formed at the leadframe inactive side 314. The overmold recess 330 can be formed by half-etching the leadframe 310 using a precision etching process having high resolution control over the depth of the etching. The overmold recess 330 can be formed directly under the routable traces 322 to facilitate the formation of the routable traces 322 that is electrically isolated from other elements.

The overmold recess 330 can be formed through the conductive layer 328 at the leadframe inactive side 314. The overmold recess 330 can be formed though a portion of the leadframe 310 at the leadframe inactive side 314.

The provisioning phase can form the leadframe 310 or simply provide the leadframe 310 as a pre-formed component. For example, the leadframe 310 can be provisioned in the manufacturing process as a completed component ready for the next phase of manufacturing.

It has been discovered forming the overmold recess 330 directly under the routable traces 322 can increase manufacturing yield and reduce error rates. By forming the overmold recess 330 under the routable traces 322, the trace height 344 can be precisely controlled by controlling the depth of the overmold recess 330. Forming the routable traces 322 with the trace height 344 controlled reduces errors and provides a higher manufacturing yield by eliminating sizing errors.

Figure 23:
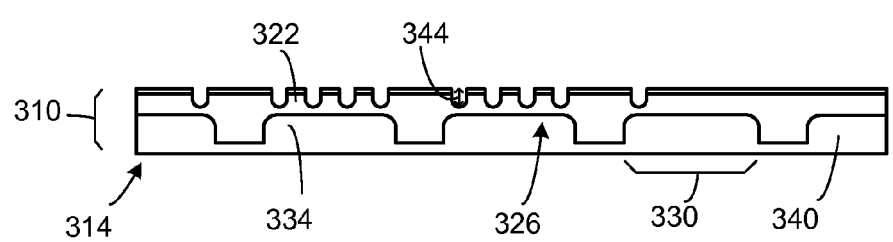
FIG. 23 is the structure of FIG. 22 in an overmolding phase of manufacturing.

Referring now to FIG. 23 therein is shown the structure of FIG. 22 in an overmolding phase of manufacturing. The overmolding phase can include an overmolding method to form the overmold layer 334 on the leadframe inactive side 314 and in the overmold recess 330 of the leadframe 310.

The overmold layer 334 can be formed by forming the overmold material 340 directly on the leadframe inactive side 314 and within the overmold recess 330. The overmold layer 334 is on and in direct contact with the overmold recess 330, the trace bottom side 326, and the leadframe inactive side 314. The overmold layer 334 can fill the overmold recess 330 and form a flat layer beyond the overmold recess 330 covering the leadframe inactive side 314, lead pad inactive side. The overmold layer 334 can act as an etch stop layer when etching the routable traces 322 allowing precise control over the trace height 344.

Figure 24:
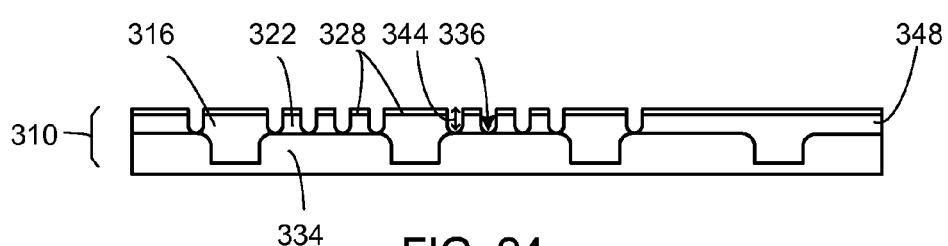
FIG. 24 is the structure of FIG. 23 in a full etch phase of manufacturing.

Referring now to FIG. 24, therein is shown the structure of FIG. 23 in a full etch phase of manufacturing. The full etch phase can include a full etch method for removing a portion of the leadframe 310 for the integrated circuit packaging system 300 of FIG. 3.

The full etch method can be performed in a variety of ways. For example, the full etch method can include chemical etch, dry etch, reactive ion etching, laser etching, or a combination thereof.

The leadframe 310 can be etched to selectively separate the lead pads 316, the routable traces 322, and the die paddle 348. The full etch method can remove material in the areas of the leadframe 310 that were partially etched.

The full etch phase can include using an etch mask to protect the lead pads 316, the routable traces 322, and the die paddle 348. The etch mask can include the conductive layer 328, a protective mask, or a combination thereof. The areas unprotected by the etch mask can be removed by the full etch method.

The removal process can remove material from the areas unprotected by the etch mask until the overmold inner side 336 is reached. The overmold layer 334 can act as an etch stop layer and allow the routable traces 322 to be formed having the trace height 344 precisely controlled. When the routable traces 322 are completely isolated from the residual portions of the leadframe 310, the routable traces 322 can be supported by the overmold layer 334.

Figure 25:
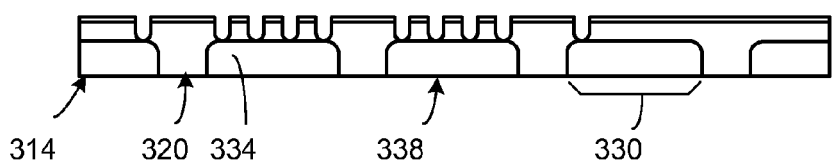
FIG. 25 is the structure of FIG. 24 in a bottom grinding phase of manufacturing.

Referring now to FIG. 25, therein is shown the structure of FIG. 24 in a bottom grinding phase of manufacturing. The bottom grinding phase can include a bottom grinding method for removing a portion of the overmold layer 334 outside of the overmold recess 330. For example, the leadframe inactive side 314 can be ground to remove the portion of the overmold layer 334 not within the overmold recess 330. After grinding, the overmold outer side 338 is coplanar with the lead pad inactive side 320.

Figure 26:
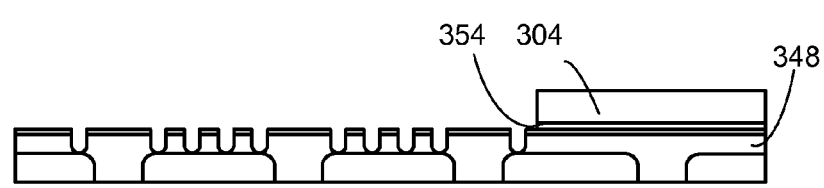
FIG. 26 is the structure of FIG. 25 in an attaching phase of manufacturing.

Referring now to FIG. 26, therein is shown the structure of FIG. 25 in an attaching phase of manufacturing. The attaching phase can include a die attach method to mount the die 304 over the die paddle 348 for the integrated circuit packaging system 300 of FIG. 3.

The die 304 can be mounted over the die paddle 348 with the adhesive layer 354. The die 304 can be mounted with the active side of the die 304 facing away from the die paddle 348 and the adhesive layer 354.

The adhesive layer 354 can be an epoxy, tape, resin, or a combination thereof. The adhesive layer 354 can be thermally conductive for dissipating heat from the die 304. The adhesive layer 354 can be electrically insulating for preventing short circuits.

The die 304 can be a variety of semiconductor components. For example, the die 304 can be a flipchip, a wire bond chip, a hybrid chip, a leadless package, or a combination thereof.

Figure 27:
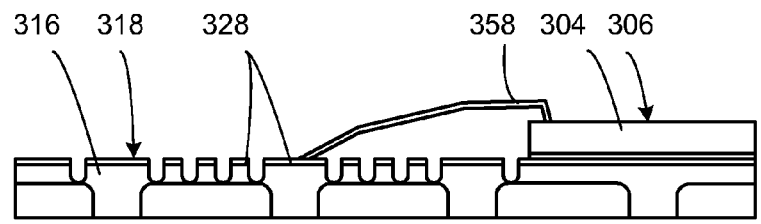
FIG. 27 is the structure of FIG. 26 in a connecting phase of manufacturing.

Referring now to FIG. 27, therein is shown the structure of FIG. 26 in a connecting phase of manufacturing. The connecting phase can include a connecting method for attaching the internal interconnects 358 between the die 304 and the lead pads 316.

The connecting phase can include attaching the internal interconnects 358 to the die 304 and to the lead pads 316. For example, the internal interconnects 358 can be a bond wire, lead, solder ball, trace, or a combination thereof.

The internal interconnects 358 can be attached to the die top side 306. The internal interconnects 358 can be attached to the conductive layer 328 on the lead pad active side 318.

Figure 28:
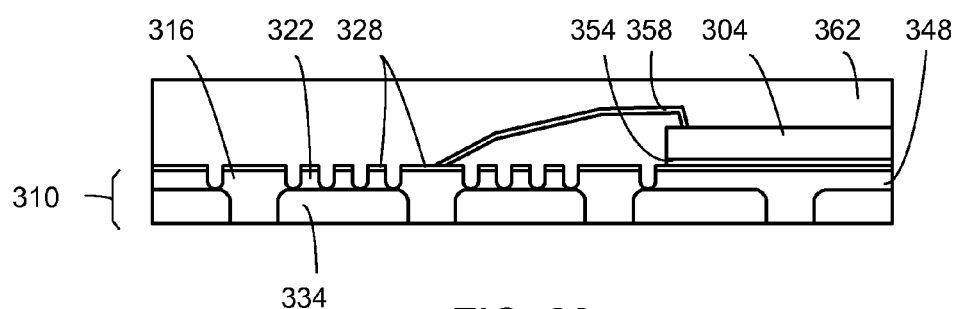
FIG. 28 is the structure of FIG. 27 in an applying phase of manufacturing.

Referring now to FIG. 28, therein is shown the structure of FIG. 27 in an applying phase of manufacturing. The applying phase can include an application method for applying the encapsulation 362 on and over the leadframe 310.

The encapsulation 362 can be applied directly on the lead pads 316, the routable traces 322, the overmold layer 334, the internal interconnects 358, the conductive layer 328, the die 304, and the adhesive layer 354. The encapsulation 362 can electrically isolate the lead pads 316, the routable traces 322, the die 304, the internal interconnects 358, and the die paddle 348. The encapsulation 362 can be an insulating material for preventing short circuits between conductive elements.

Figure 29:
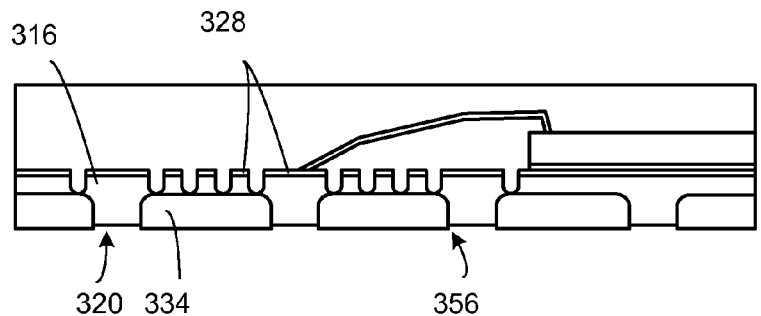
FIG. 29 is the structure of FIG. 28 in a bottom etching phase of manufacturing.

Referring now to FIG. 29, therein is shown the structure of FIG. 28 in a bottom etching phase of manufacturing. The bottom etching phase can include a bottom etch method for removing portions of the lead pads 316 to form the lead recess 356.

The bottom etching phase can remove a portion of the conductive layer 328 and a portion of the lead pads 316 on the lead pad inactive side 320 to form the lead recess 356. The lead recess 356 is formed at the lead pad inactive side 320 and between adjacent ones of the overmold layer 334.

The bottom etching method can be implemented in a variety of ways. For example, the bottom etching method can include wet etching, dry etching, reactive ion etching, laser etching, laser ablation, grinding, buffing, or a combination thereof.

Figure 30:
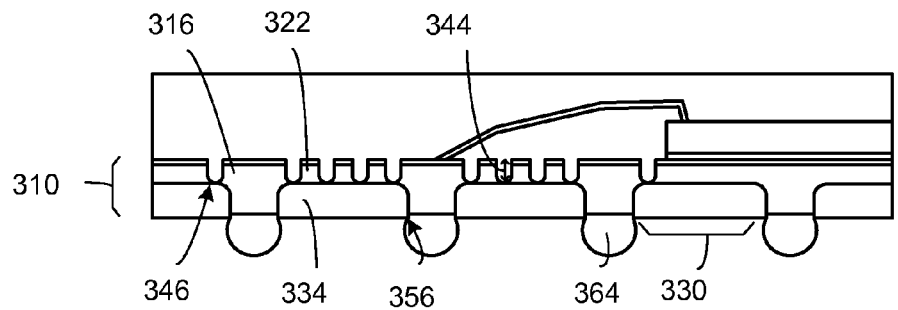
FIG. 30 is the structure of FIG. 29 in an external interconnect phase of manufacturing.

Referring now to FIG. 30, therein is shown the structure of FIG. 29 in an external interconnect phase of manufacturing. The external interconnect phase can include an external interconnect method for attaching the external interconnects 364 to the lead recess 356. The lead recess 356 can provide an electrically conductive location for attaching the external interconnects 364. Positioning the external interconnects 364 within the lead recess 356 can form a mold lock with the overmold layer 334.

It has been discovered that forming the external interconnects 364 within the lead recess 356 and surrounded by the overmold layer 334 can increase manufacturing yield and reduce errors. The external interconnects 364 within the lead recess 356 forms a horizontal mold lock to impede horizontal motion and reduce the likelihood of separation.

It has been discovered that etching between the lead pads 316 and the routable traces 322 until reaching the etch stop 346 provided by the overmold layer 334 in the overmold recess 330 provides increased manufacturing yield and reduced error rates. Etching until the overmold layer 334 provides an improved etching process with precise control over the depth of etching and the trace height 344, thus reducing size errors and allowing improved control over the conductivity of the routable traces 322.

It has been discovered that forming the overmold layer 334 within the overmold recess 330 formed by half-etching the leadframe 310 increases manufacturing yield and reduces error rates. Forming the overmold recess 330 to a precise depth with the half-etch process allows the overmold layer 334 to act as the etch stop 346 to more accurately control the trace height 344 of the routable traces 322.

Figure 31:
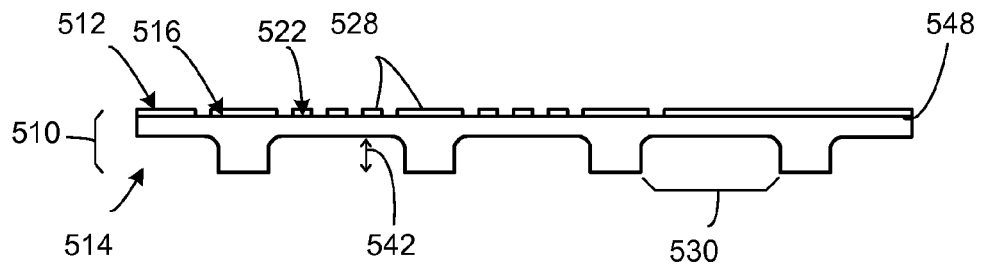
FIG. 31 is the structure of FIG. 5 in a provisioning phase of manufacturing.

Referring now to FIG. 31, therein is shown the structure of FIG. 5 in a provisioning phase of manufacturing. The provisioning phase can include a forming method to partially etch the leadframe inactive side 514 of the leadframe 510 to form the overmold recess 530.

The overmold recess 530 can be etched to the overmold recess depth 542. For example, the overmold recess 530 can be formed by etching the leadframe 510 using a deep half etch process.

The leadframe 510 can be plated with the conductive layer 528. The leadframe 510 can include the conductive layer 528 on the leadframe active side 512. For example, the conductive layer 528 can be a portion of a pre-plated leadframe (PPF).

The upper portions of the lead pads 516, the routable traces 522, and the die paddle 548 are not partially etched. However, the conductive layer 528 can form a protective mask defining the positions of the lead pads 516, the routable traces 522, and the die paddle 548.

The conductive layer 528 can be formed directly on the leadframe 510 to increase conductivity. For example, the conductive layer 528 can be a layer of copper formed over the leadframe active side 512.

The leadframe 510 can include the overmold recess 530 formed at the leadframe inactive side 514. The overmold recess 530 can be formed by half-etching the leadframe 510 using a precision etching process having high resolution control over the depth of the etching. The overmold recess 530 can be formed directly under the routable traces 522 to facilitate the formation of the routable traces 522 that is electrically isolated from other elements.

The overmold recess 530 can be formed through the conductive layer 528 at the leadframe inactive side 514. The overmold recess 530 can be formed though a portion of the leadframe 510 at the leadframe inactive side 514.

The provisioning phase can form the leadframe 510 or simply provide the leadframe 510 as a pre-formed component. For example, the leadframe 510 can be provisioned in the manufacturing process as a completed component ready for the next phase of manufacturing.

It has been discovered forming the overmold recess 530 directly under the routable traces 522 can increase manufacturing yield and reduce error rates. By forming the overmold recess 530 under the routable traces 522, the trace height 544 of FIG. 5 can be precisely controlled by controlling the depth of the overmold recess 530. Forming the routable traces 522 with the trace height 544 controlled reduces errors and provides a higher manufacturing yield by eliminating sizing errors.

Figure 32:
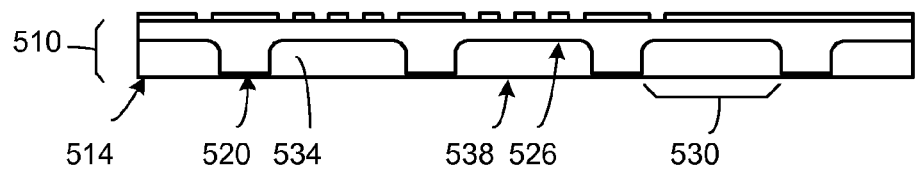
FIG. 32 is the structure of FIG. 31 in an overmolding phase of manufacturing.

Referring now to FIG. 32 therein is shown the structure of FIG. 31 in an overmolding phase of manufacturing. The overmolding phase can include an overmolding method to form the overmold layer 534 on the leadframe inactive side 514 and in the overmold recess 530 of the leadframe 510.

The overmold layer 534 can be formed by forming the overmold material 540 in a thin layer directly on the leadframe inactive side 514 and within the overmold recess 530. The overmold layer 534 is on and in direct contact with the overmold recess 530, the trace bottom side 526, and the leadframe inactive side 514. The overmold layer 534 can fill the overmold recess 530 and form a flat layer beyond the overmold recess 530 covering the leadframe inactive side 514, lead pad inactive side. The overmold layer 534 can act as an etch stop layer when etching the routable traces 522 allowing precise control over the trace height 544.

Figure 33:
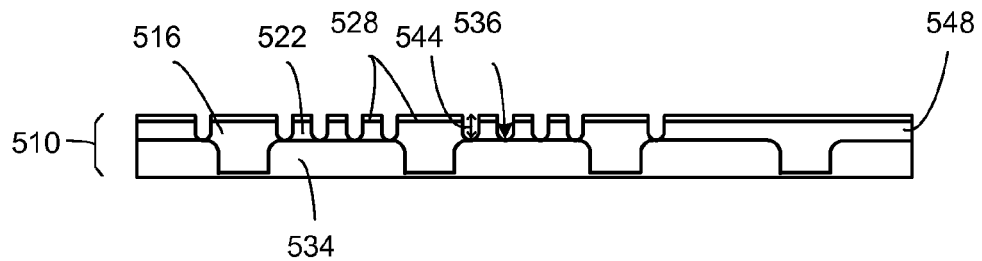
FIG. 33 is the structure of FIG. 32 in a full etch phase of manufacturing.

Referring now to FIG. 33, therein is shown the structure of FIG. 32 in a full etch phase of manufacturing. The full etch phase can include a full etch method for removing a portion of the leadframe 510 for the integrated circuit packaging system 500 of FIG. 5.

The full etch phase can include using an etch mask to protect and define the lead pads 516, the routable traces 522, and the die paddle 548. The etch mask can include the conductive layer 528, a protective mask, or a combination thereof. The areas unprotected by the etch mask can be removed by the full etch method.

The leadframe 510 can be etched to form the lead pads 516, the routable traces 522, and the die paddle 548. The full etch method can remove material in the areas of the leadframe 510 that are not protected by the etch mask.

The removal process can remove material from the areas unprotected by the etch mask until the overmold inner side 536 is reached. The overmold layer 534 can act as an etch stop layer and allow the routable traces 522 to be formed having the trace height 544 precisely controlled. When the routable traces 522 are completely isolated from the residual portions of the leadframe 510, the routable traces 522 can be supported by the overmold layer 534.

The full etch method can be performed in a variety of ways. For example, the full etch method can include chemical etch, dry etch, reactive ion etching, laser etching, or a combination thereof.

Figure 34:
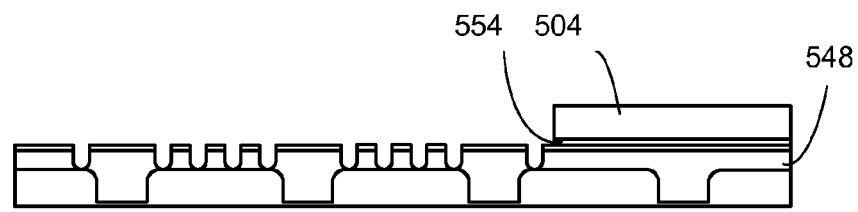
FIG. 34 is the structure of FIG. 33 in an attaching phase of manufacturing.

Referring now to FIG. 34, therein is shown the structure of FIG. 33 in an attaching phase of manufacturing. The attaching phase can include a die attach method to mount the die 504 over the die paddle 548 for the integrated circuit packaging system 500 of FIG. 5.

The die 504 can be mounted over the die paddle 548 with the adhesive layer 554. The die 504 can be mounted with the active side of the die 504 facing away from the die paddle 548 and the adhesive layer 554.

The adhesive layer 554 can be an epoxy, tape, resin, or a combination thereof. The adhesive layer 554 can be thermally conductive for dissipating heat from the die 504. The adhesive layer 554 can be electrically insulating for preventing short circuits.

The die 504 can be a variety of semiconductor components. For example, the die 504 can be a flipchip, a wire bond chip, a hybrid chip, a leadless package, or a combination thereof.

Figure 35:
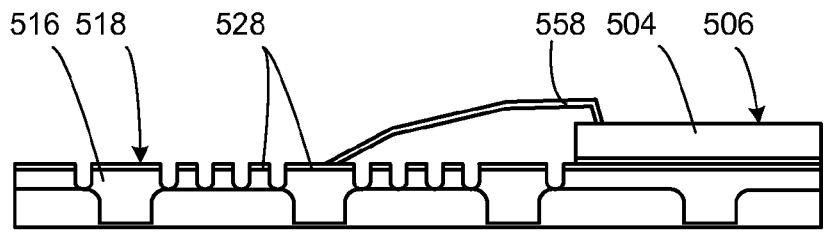
FIG. 35 is the structure of FIG. 34 in a connecting phase of manufacturing.

Referring now to FIG. 35, therein is shown the structure of FIG. 34 in a connecting phase of manufacturing. The connecting phase can include a connecting method for attaching the internal interconnects 558 between the die 504 and the lead pads 516.

The connecting phase can include attaching the internal interconnects 558 to the die 504 and to the lead pads 516. For example, the internal interconnects 558 can be a bond wire, lead, solder ball, trace, or a combination thereof.

The internal interconnects 558 can be attached to the die top side 506. The internal interconnects 558 can be attached to the conductive layer 528 on the lead pad active side 518.

Figure 36:
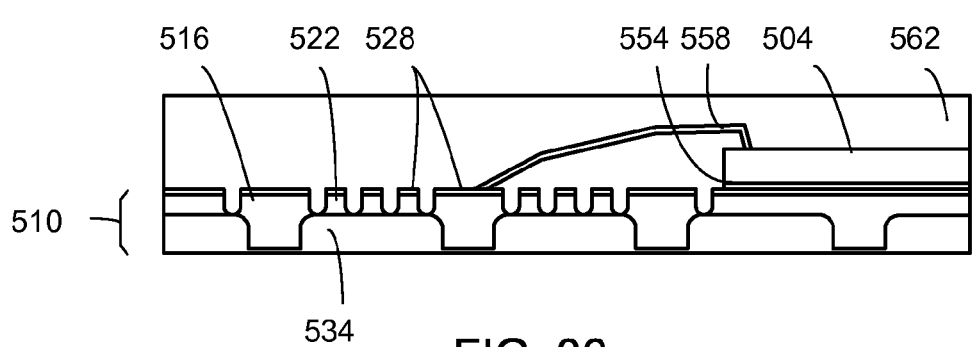
FIG. 36 is the structure of FIG. 35 in an applying phase of manufacturing.

Referring now to FIG. 36, therein is shown the structure of FIG. 35 in an applying phase of manufacturing. The applying phase can include an application method for applying the encapsulation 562 on and over the leadframe 510.

The encapsulation 562 can be applied directly on the lead pads 516, the routable traces 522, the overmold layer 534, the internal interconnects 558, the conductive layer 528, the die 504, and the adhesive layer 554. The encapsulation 562 can electrically isolate the lead pads 516, the routable traces 522, the die 504, the internal interconnects 558, and the die paddle 548. The encapsulation 562 can be an insulating material for preventing short circuits between conductive elements.

Figure 37:
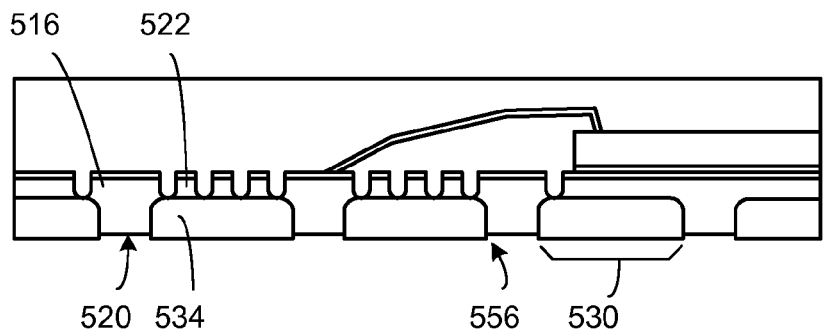
FIG. 37 is the structure of FIG. 36 in a bottom etching phase of manufacturing.

Referring now to FIG. 37, therein is shown the structure of FIG. 36 in a bottom etching phase of manufacturing. The bottom etching phase can include a bottom etch method for removing portions of the overmold layer 534 and portions of the lead pads 516 to form the lead recess 556.

The bottom etching phase can remove the bottom layer portion of the overmold layer 534 outside of the overmold recess 530 to separate the portions of the overmold layer 534 within the overmold recess 530. The overmold layer 534 within the overmold recess 530 is positioned directly below the routable traces 522.

The bottom etching phase can remove a portion of the lead pads 516 on the lead pad inactive side 520 to form the lead recess 556. The lead recess 556 is formed at the lead pad inactive side 520 and between adjacent ones of the overmold layer 534 within the overmold recess 530.

The bottom etching method can be implemented in a variety of ways. For example, the bottom etching method can include wet etching, dry etching, reactive ion etching, laser etching, laser ablation, grinding, buffing, or a combination thereof.

Figure 38:
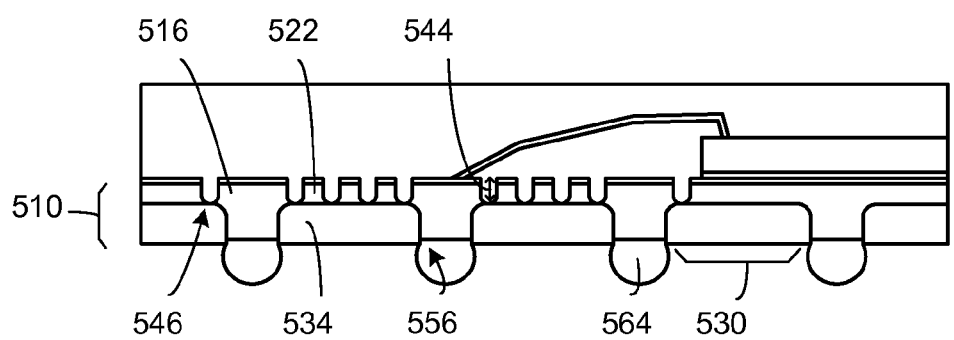
FIG. 38 is the structure of FIG. 37 in an external interconnect phase of manufacturing.

Referring now to FIG. 38, therein is shown the structure of FIG. 37 in an external interconnect phase of manufacturing. The external interconnect phase can include an external interconnect method for attaching the external interconnects 564 to the lead recess 556. The lead recess 556 can provide an electrically conductive location for attaching the external interconnects 564. Positioning the external interconnects 564 within the lead recess 556 can form a mold lock with the overmold layer 534.

It has been discovered that etching between the lead pads 516 and the routable traces 522 until reaching the etch stop 546 provided by the overmold layer 534 in the overmold recess 530 provides increased manufacturing yield and reduced error rates. Etching until the overmold layer 534 provides an improved etching process with precise control over the depth of etching and the trace height 544, thus reducing size errors and allowing improved control over the conductivity of the routable traces 522.

It has been discovered that forming the overmold layer 534 within the overmold recess 530 formed by half-etching the leadframe 510 increases manufacturing yield and reduces error rates. Forming the overmold recess 530 to a precise depth with the half-etch process allows the overmold layer 534 to act as the etch stop 546 to more accurately control the trace height 544 of the routable traces 522.

Figure 39:
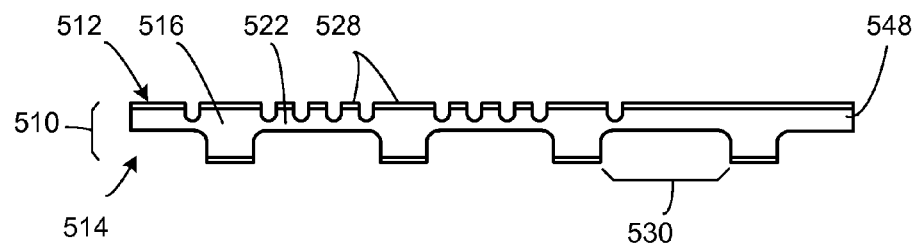
FIG. 39 is the structure of FIG. 5 in a provisioning phase of manufacturing.

Referring now to FIG. 39, therein is shown the structure of FIG. 5 in a provisioning phase of manufacturing. The provisioning phase can include a forming method to partially etch the leadframe active side 512 of the leadframe 510 to form upper portions of the lead pads 516, the routable traces 522, and the die paddle 548.

The leadframe 510 can be plated with the conductive layer 528. The leadframe 510 can include the conductive layer 528 on the leadframe active side 512. The leadframe 510 can include another of the conductive layer 528 on the leadframe inactive side 514. For example, the conductive layer 528 can be a portion of a pre-plated leadframe (PPF).

The conductive layer 528 can be formed directly on the leadframe 510 to increase conductivity. For example, the conductive layer 528 can be a layer of copper formed over the leadframe active side 512 or the leadframe inactive side 514.

The upper portions of the lead pads 516, the routable traces 522, and the die paddle 548 can be formed by partially etching the leadframe active side 512 including the conductive layer 528. The leadframe 510 can be etched by forming a protective mask (not shown) defining the location of the lead pads 516, the routable traces 522, and the die paddle 548 and then removing portions of the unprotected areas of the leadframe 510 with an etching process. The etching process can include a chemical etch, reactive ion beam etching, laser etching, or a combination thereof.

The leadframe 510 can include the overmold recess 530 formed at the leadframe inactive side 514. The overmold recess 530 can be formed by half-etching the leadframe 510 using a precision etching process having high resolution control over the depth of the etching. The overmold recess 530 can be formed directly under the routable traces 522 to facilitate the formation of the routable traces 522 that is electrically isolated from other elements.

The overmold recess 530 can be formed through the conductive layer 528 at the leadframe inactive side 514. The overmold recess 530 can be formed though a portion of the leadframe 510 at the leadframe inactive side 514.

The provisioning phase can form the leadframe 510 or simply provide the leadframe 510 as a pre-formed component. For example, the leadframe 510 can be provisioned in the manufacturing process as a completed component ready for the next phase of manufacturing.

It has been discovered forming the overmold recess 530 directly under the routable traces 522 can increase manufacturing yield and reduce error rates. By forming the overmold recess 530 under the routable traces 522, the trace height 544 of FIG. 5 can be precisely controlled by controlling the depth of the overmold recess 530. Forming the routable traces 522 with the trace height 544 controlled reduces errors and provides a higher manufacturing yield by eliminating sizing errors.

Figure 40:
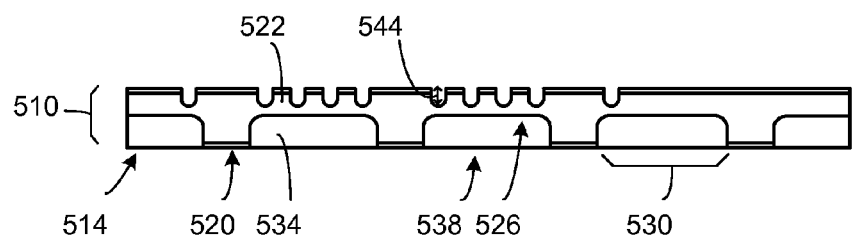
FIG. 40 is the structure of FIG. 39 in an overmolding phase of manufacturing.

Referring now to FIG. 40, therein is shown the structure of FIG. 39 in an overmolding phase of manufacturing. The overmolding phase can include an overmolding method to form the overmold layer 534 in the overmold recess 530 of the leadframe 510.

The overmold layer 534 can be formed within the overmold recess 530 at the leadframe inactive side 514. The overmold layer 534 is on and in direct contact with the overmold recess 530 and the trace bottom side 526.

The overmold outer side 538 can be coplanar with the leadframe inactive side 514 and the lead pad inactive side 520. The overmold layer 534 can act as an etch stop layer when etching the routable traces 522 allowing precise control over the trace height 544.

Figure 41:
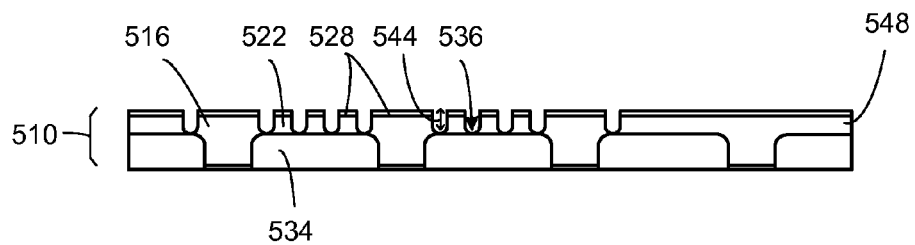
FIG. 41 is the structure of FIG. 40 in a full etch phase of manufacturing.

Referring now to FIG. 41, therein is shown the structure of FIG. 40 in a full etch phase of manufacturing. The full etch phase can include a full etch method for removing a portion of the leadframe 510 for the integrated circuit packaging system 500 of FIG. 5.

The full etch method can be performed in a variety of ways. For example, the full etch method can include chemical etch, dry etch, reactive ion etching, laser etching, or a combination thereof.

The leadframe 510 can be etched to selectively separate the lead pads 516, the routable traces 522, and the die paddle 548. The full etch method can remove material in the areas of the leadframe 510 that were partially etched.

The full etch phase can include using an etch mask to protect the lead pads 516, the routable traces 522, and the die paddle 548. The etch mask can include the conductive layer 528, a protective mask, or a combination thereof. The areas unprotected by the etch mask can be removed by the full etch method.

The removal process can remove material from the areas unprotected by the etch mask until the overmold inner side 536 is reached. The overmold layer 534 can act as an etch stop layer and allow the routable traces 522 to be formed having the trace height 544 precisely controlled. When the routable traces 522 are completely isolated from the residual portions of the leadframe 510, the routable traces 522 can be supported by the overmold layer 534.

Figure 42:
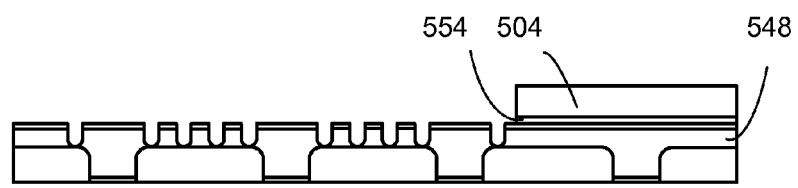
FIG. 42 is the structure of FIG. 41 in an attaching phase of manufacturing.

Referring now to FIG. 42, therein is shown the structure of FIG. 41 in an attaching phase of manufacturing. The attaching phase can include a die attach method to mount the die 504 over the die paddle 548 for the integrated circuit packaging system 500 of FIG. 5.

The die 504 can be mounted over the die paddle 548 with the adhesive layer 554. The die 504 can be mounted with the active side of the die 504 facing away from the die paddle 548 and the adhesive layer 554.

The adhesive layer 554 can be an epoxy, tape, resin, or a combination thereof. The adhesive layer 554 can be thermally conductive for dissipating heat from the die 504. The adhesive layer 554 can be electrically insulating for preventing short circuits.

The die 504 can be a variety of semiconductor components. For example, the die 504 can be a flipchip, a wire bond chip, a hybrid chip, a leadless package, or a combination thereof.

Figure 43:
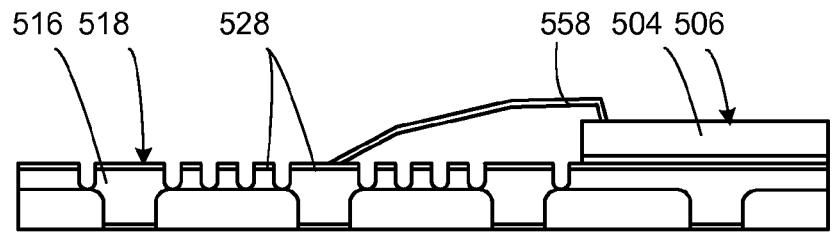
FIG. 43 is the structure of FIG. 42 in a connecting phase of manufacturing.

Referring now to FIG. 43, therein is shown the structure of FIG. 42 in a connecting phase of manufacturing. The connecting phase can include a connecting method for attaching the internal interconnects 558 between the die 504 and the lead pads 516.

The connecting phase can include attaching the internal interconnects 558 to the die 504 and to the lead pads 516. For example, the internal interconnects 558 can be a bond wire, lead, solder ball, trace, or a combination thereof.

The internal interconnects 558 can be attached to the die top side 506. The internal interconnects 558 can be attached to the conductive layer 528 on the lead pad active side 518.

Figure 44:
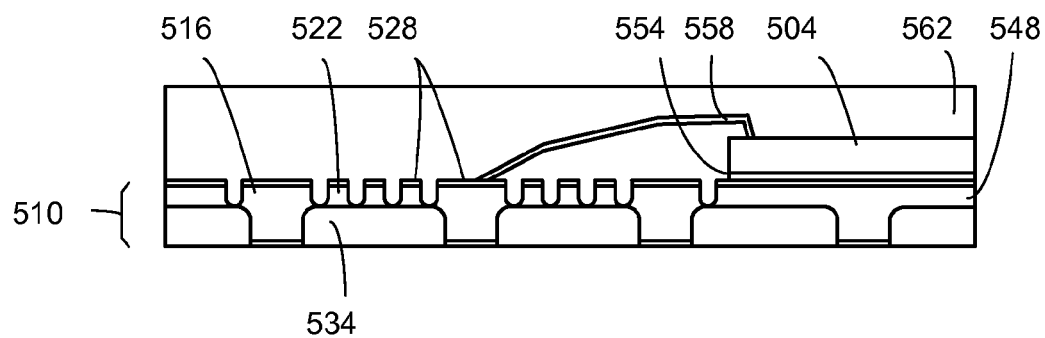
FIG. 44 is the structure of FIG. 43 in an applying phase of manufacturing.

Referring now to FIG. 44, therein is shown the structure of FIG. 43 in an applying phase of manufacturing. The applying phase can include an application method for applying the encapsulation 562 on and over the leadframe 510.

The encapsulation 562 can be applied directly on the lead pads 516, the routable traces 522, the overmold layer 534, the internal interconnects 558, the conductive layer 528, the die 504, and the adhesive layer 554. The encapsulation 562 can electrically isolate the lead pads 516, the routable traces 522, the die 504, the internal interconnects 558, and the die paddle 548. The encapsulation 562 can be an insulating material for preventing short circuits between conductive elements.

Figure 45:
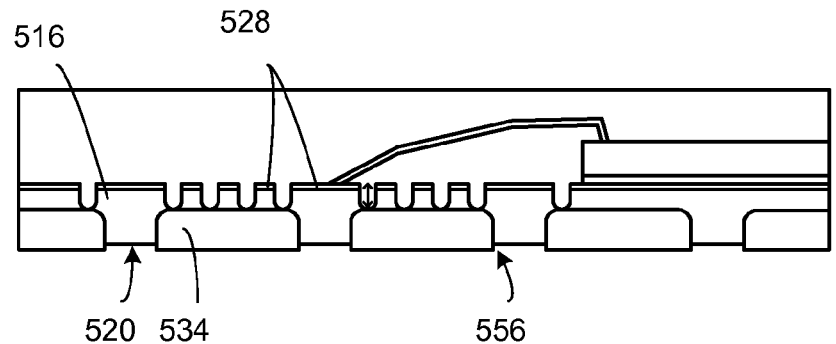
FIG. 45 is the structure of FIG. 44 in a bottom etching phase of manufacturing.

Referring now to FIG. 45, therein is shown the structure of FIG. 44 in a bottom etching phase of manufacturing. The bottom etching phase can include a bottom etch method for removing the conductive layer 528 at the lead pad inactive side 520 and portions of the lead pads 516 to form the lead recess 556.

The bottom etching phase can remove a portion of the conductive layer 528 and a portion of the lead pads 516 on the lead pad inactive side 520 to form the lead recess 556. The lead recess 556 is formed at the lead pad inactive side 520 and between adjacent ones of the overmold layer 534. The lead recess 556 can provide an electrically conductive location for forming connections to external systems (not shown).

The bottom etching method can be implemented in a variety of ways. For example, the bottom etching method can include wet etching, dry etching, reactive ion etching, laser etching, laser ablation, grinding, buffing, or a combination thereof.

Figure 46:
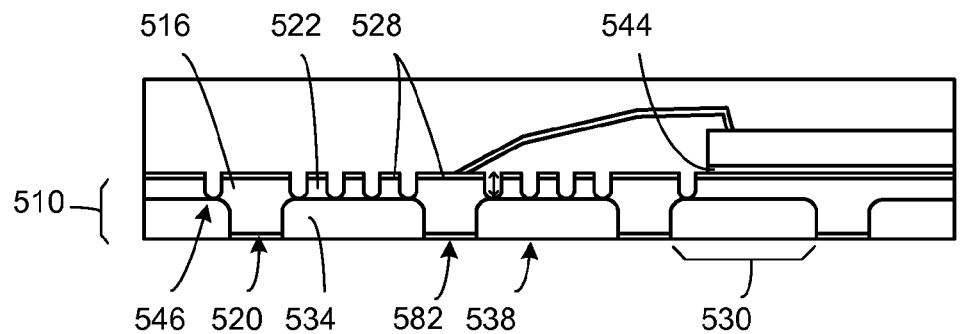
FIG. 46 is the structure of FIG. 44 in an overmold removal phase of manufacturing.

Referring now to FIG. 46, therein is shown the structure of FIG. 44 in an overmold removal phase of manufacturing. The overmold removal phase can include an overmold removal method for removing a portion of the bottom layer of the overmold layer 534 to form a leadless connector 582 by exposing the conductive layer 528 at the lead pad inactive side 520. The leadless connector 582 is an electrically conductive structure. The leadless connector 582 is coplanar with the overmold outer side 538.

The overmold removal method can be implemented in a variety of ways. For example, the overmold removal method can include wet etching, dry etching, reactive ion etching, laser etching, laser ablation, grinding, buffing, or a combination thereof.

It has been discovered that etching between the lead pads 516 and the routable traces 522 until reaching the etch stop 546 provided by the overmold layer 534 in the overmold recess 530 provides increased manufacturing yield and reduced error rates. Etching until the overmold layer 534 provides an improved etching process with precise control over the depth of etching and the trace height 544, thus reducing size errors and allowing improved control over the conductivity of the routable traces 522.

It has been discovered that forming the overmold layer 534 within the overmold recess 530 formed by half-etching the leadframe 510 increases manufacturing yield and reduces error rates. Forming the overmold recess 530 to a precise depth with the half-etch process allows the overmold layer 534 to act as the etch stop 546 to more accurately control the trace height 544 of the routable traces 522.

Figure 47:
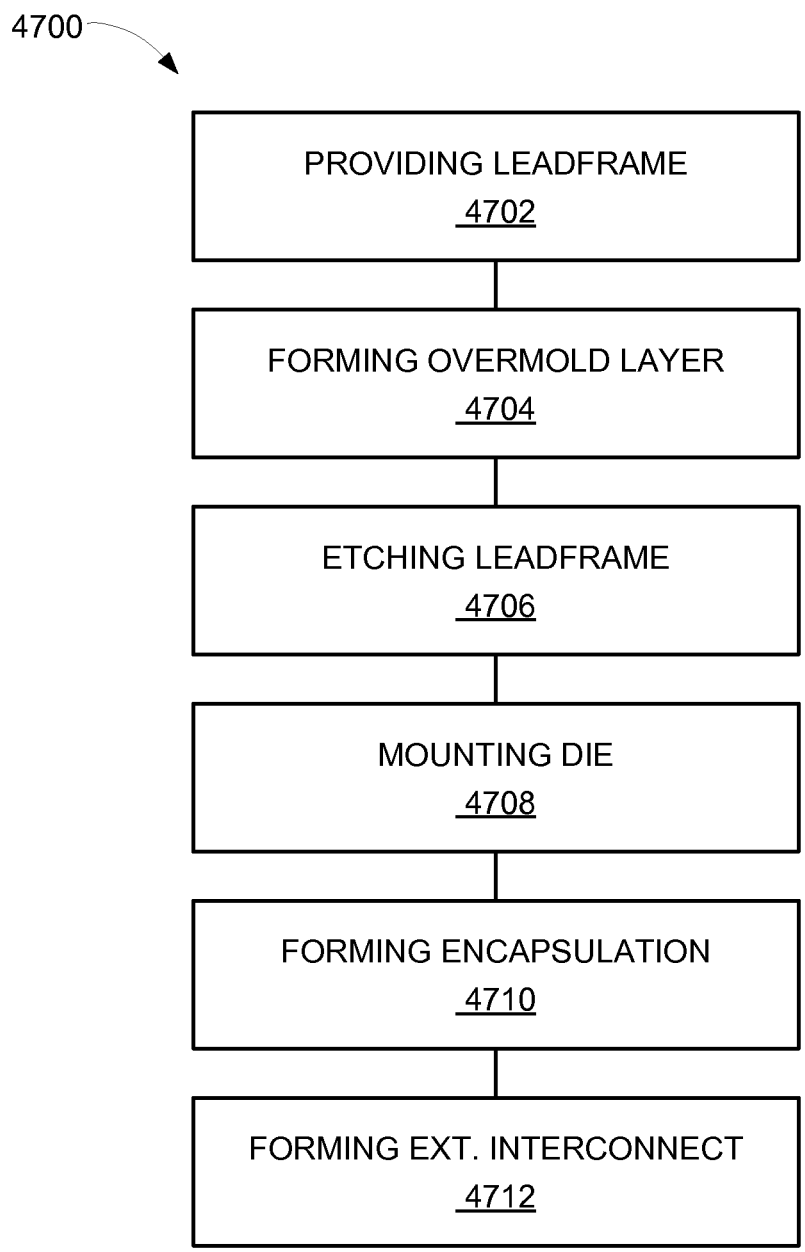
FIG. 47 is a flow chart of a method of manufacture of an integrated circuit packaging system in a further embodiment of the present invention.

Referring now to FIG. 47, therein is shown a flow chart of a method 4700 of manufacture of an integrated circuit packaging system in a further embodiment of the present invention. The method 4700 includes: providing a leadframe with a conductive layer at a leadframe active side for protecting a lead pad and a routable trace, the leadframe having an overmold recess at a leadframe inactive side in a block 4702; forming an overmold layer in the overmold recess in a block 4704; etching a portion of the leadframe between the lead pad and the routable trace to expose the overmold layer for forming the lead pad and routable trace in a block 4706; mounting a die over the leadframe in a block 4708; forming an encapsulation directly on the conductive layer, the lead pad, the routable trace, the die, and the overmold layer in a block 4710; and forming an external interconnect at the leadframe inactive side in a block 4712.

Thus, it has been discovered that the integrated circuit packaging system of the present invention furnishes important and heretofore unknown and unavailable solutions, capabilities, and functional aspects for an integrated circuit packaging system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a leadframe with a conductive layer at a leadframe active side for protecting a lead pad and a routable trace, the leadframe having an overmold recess at a leadframe inactive side;
forming an overmold layer in the overmold recess;
etching a portion of the leadframe between the lead pad and the routable trace to expose the overmold layer for forming the lead pad and routable trace;
mounting a die over the leadframe;
forming an encapsulation directly on the conductive layer, the lead pad, the routable trace, the die, and the overmold layer; and
forming an external interconnect at the leadframe inactive side.

2. The method as claimed in claim 1 wherein providing the leadframe includes forming the conductive layer at the leadframe inactive side.

3. The method as claimed in claim 1 wherein forming the overmold layer includes forming the overmold layer with an overmold recess depth.

4. The method as claimed in claim 1 wherein etching the leadframe includes etching the leadframe using the overmold layer as an etch stop for controlling the trace height.

5. The method as claimed in claim 1 wherein mounting the die includes mounting a flip chip, wire bond chip, hybrid chip, or a combination thereof.

6. A method of manufacture of an integrated circuit packaging system comprising:
providing a leadframe with a conductive layer on a leadframe active side for protecting a lead pad and a routable trace, the leadframe having an overmold recess at a leadframe inactive side;
forming an overmold layer in the overmold recess;
etching a portion of the leadframe between the lead pad and the routable trace to expose the overmold inner side of the overmold layer for forming the lead pad and routable trace;
mounting a die over the leadframe;
connecting an internal interconnect between the die and the leadframe;
forming an encapsulation directly on the conductive layer, the lead pad, the routable trace, the die, the internal interconnect, and the overmold layer; and
forming an external interconnect at the leadframe inactive side.

7. The method as claimed in claim 6 wherein providing the leadframe includes forming the conductive layer at the lead pad inactive side of the lead pad and the trace bottom side of the routable trace.

8. The method as claimed in claim 6 wherein forming the overmold layer includes forming the overmold layer with an overmold recess depth in the overmold recess.

9. The method as claimed in claim 6 wherein etching the leadframe includes etching the leadframe using the overmold inner side of the overmold layer as an etch stop for controlling the trace height.

10. The method as claimed in claim 6 further comprising:
   etching the lead pad for forming a lead recess between the lead pad inactive side and the overmold layer;
   forming an external interconnect at the lead recess; and
   wherein:
   mounting the die includes mounting a flip chip, wire bond chip, hybrid chip, or a combination thereof.

11. An integrated circuit packaging system comprising:
   a leadframe with a conductive layer on a leadframe active side for protecting a lead pad and a routable trace, the leadframe having an overmold recess at a leadframe inactive side;
   an overmold layer in the overmold recess, the overmold layer exposed between the lead pad and the routable trace for forming the lead pad and routable trace;
   an encapsulation directly on the conductive layer, the lead pad, the routable trace, and the overmold layer; and
   an external interconnect at the leadframe inactive side.

12. The system as claimed in claim 11 wherein the leadframe includes the conductive layer on the leadframe inactive side.

13. The system as claimed in claim 11 wherein the overmold layer is formed with an overmold recess depth.

14. The system as claimed in claim 11 wherein the leadframe is etched down to an etch stop at the overmold layer for controlling the trace height.

15. The system as claimed in claim 11 wherein the die is a flip chip, wire bond chip, hybrid chip, or a combination thereof.

16. The system as claimed in claim 11 further comprising:
   an internal interconnect is between the die and the leadframe; and
   wherein:
   the encapsulation is directly on the conductive layer, the lead pad, the routable trace, the die, the internal interconnect, and the overmold layer.

17. The system as claimed in claim 16 wherein the leadframe includes the conductive layer at the lead pad inactive side of the lead pad and the trace bottom side of the routable trace.

18. The system as claimed in claim 16 wherein the overmold layer is formed with an overmold recess depth in the overmold recess.

19. The system as claimed in claim 16 wherein the leadframe is etched down to an etch stop at the overmold inner side of the overmold layer for controlling the trace height.

20. The system as claimed in claim 16 further comprising:
   the lead pad having a lead recess between the lead pad inactive side and the overmold layer;
   an external interconnect at the lead recess; and
   wherein:
   the die is a flip chip, wire bond chip, hybrid chip, or a combination thereof.

* * * * *